US008848430B2

(12) United States Patent
Costa et al.

(10) Patent No.: US 8,848,430 B2
(45) Date of Patent: Sep. 30, 2014

(54) STEP SOFT PROGRAM FOR REVERSIBLE RESISTIVITY-SWITCHING ELEMENTS

(75) Inventors: Xiying Chen Costa, San Jose, CA (US); Roy Scheuerlein, Cupertino, CA (US); Abhijit Bandyopadhyay, San Jose, CA (US); Brian Le, San Jose, CA (US); Li Xiao, San Jose, CA (US); Tao Du, Palo Alto, CA (US); Chandrasekhar R. Gorla, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 986 days.

(21) Appl. No.: 12/949,146

(22) Filed: Nov. 18, 2010

(65) Prior Publication Data

US 2011/0205782 A1 Aug. 25, 2011

Related U.S. Application Data

(60) Provisional application No. 61/307,245, filed on Feb. 23, 2010.

(51) Int. Cl.
*G11C 11/00* (2006.01)
*G11C 14/00* (2006.01)
*G11C 5/02* (2006.01)

(52) U.S. Cl.
CPC . *G11C 14/00* (2013.01); *G11C 5/02* (2013.01)
USPC .......................................... 365/158; 365/173

(58) Field of Classification Search
CPC ................................ G11C 11/16; H01L 43/02
USPC .................................................. 365/158, 173
See application file for complete search history.

(56) References Cited

U.S. PATENT DOCUMENTS

| 5,243,226 | A | 9/1993 | Chan |
| 5,825,046 | A | 10/1998 | Czubatyj et al. |
| 6,473,332 | B1 | 10/2002 | Ignatiev et al. |
| 6,870,768 | B2 | 3/2005 | Cernea et al. |
| 7,006,371 | B2 | 2/2006 | Matsuoka |

(Continued)

FOREIGN PATENT DOCUMENTS

| WO | 2007103220 A2 | 9/2007 |
| WO | 2009011221 A1 | 1/2009 |

(Continued)

OTHER PUBLICATIONS

Response to Office Action dated May 18, 2012, U.S. Appl. No. 12/642,191, filed Dec. 18, 2009, 14 pages.

(Continued)

*Primary Examiner* — Michael Tran
(74) *Attorney, Agent, or Firm* — Vierra Magen Marcus LLP

(57) ABSTRACT

A method and system for forming, resetting, or setting memory cells is disclosed. One or more programming conditions to apply to a memory cell having a reversible resistivity-switching element may be determined based on its resistance. The determination of one or more programming conditions may also be based on a pre-determined algorithm that may be based on properties of the memory cell. The one or more programming conditions may include a programming voltage and a current limit. For example, the magnitude of the programming voltage may be based on the resistance. As another example, the width of a programming voltage pulse may be based on the resistance. In some embodiments, a current limit used during programming is determined based on the memory cell resistance.

34 Claims, 22 Drawing Sheets

(56) References Cited

U.S. PATENT DOCUMENTS

| | | |
|---|---|---|
| 7,187,228 B1 | 3/2007 | Jain et al. |
| 7,289,351 B1 | 10/2007 | Chen et al. |
| 7,345,907 B2 | 3/2008 | Scheuerlein |
| 7,369,431 B2 | 5/2008 | Muraoka et al. |
| 7,382,647 B1 | 6/2008 | Gopalakrishnan |
| 7,426,128 B2 | 9/2008 | Scheuerlein |
| 7,463,506 B2 | 12/2008 | Muraoka et al. |
| 7,463,546 B2 | 12/2008 | Fasoli et al. |
| 7,480,174 B2 | 1/2009 | Lee et al. |
| 7,499,304 B2 | 3/2009 | Scheuerlein et al. |
| 7,558,099 B2 | 7/2009 | Morimoto |
| 7,668,001 B2 | 2/2010 | Tajiri et al. |
| 7,701,748 B2 | 4/2010 | Lee et al. |
| 7,791,923 B2 | 9/2010 | Baek et al. |
| 7,826,248 B2 | 11/2010 | Xi et al. |
| 7,957,203 B2 | 6/2011 | Nagashima et al. |
| 7,960,224 B2 | 6/2011 | Chien et al. |
| 7,974,117 B2 | 7/2011 | Tan et al. |
| 8,049,305 B1 | 11/2011 | Miller et al. |
| 8,053,364 B2 | 11/2011 | French et al. |
| 8,062,918 B2 | 11/2011 | Miller et al. |
| 8,188,466 B2 | 5/2012 | Kawano et al. |
| 2006/0126380 A1 | 6/2006 | Osada et al. |
| 2007/0008770 A1 | 1/2007 | Nagao et al. |
| 2008/0123389 A1 | 5/2008 | Cho et al. |
| 2008/0151601 A1 | 6/2008 | Kang et al. |
| 2008/0205124 A1* | 8/2008 | Inaba ............ 365/158 |
| 2008/0211011 A1 | 9/2008 | Takashima et al. |
| 2009/0003044 A1 | 1/2009 | Happ et al. |
| 2009/0039336 A1 | 2/2009 | Terao et al. |
| 2009/0059652 A1 | 3/2009 | Taguchi |
| 2009/0086521 A1 | 4/2009 | Herner et al. |
| 2009/0109737 A1 | 4/2009 | Kostylev |
| 2009/0147563 A1 | 6/2009 | Happ et al. |
| 2009/0251950 A1* | 10/2009 | Klostermann ............ 365/158 |
| 2009/0258489 A1 | 10/2009 | Chen et al. |
| 2010/0067281 A1 | 3/2010 | Xi et al. |
| 2010/0103717 A1* | 4/2010 | Lee et al. ............ 365/148 |
| 2011/0002154 A1* | 1/2011 | Mitani et al. ............ 365/148 |
| 2011/0110144 A1 | 5/2011 | Kawai et al. |
| 2011/0280059 A1 | 11/2011 | Xiao et al. |

FOREIGN PATENT DOCUMENTS

| | | |
|---|---|---|
| WO | 2009114200 A1 | 9/2009 |
| WO | 2009150608 A1 | 12/2009 |
| WO | 2010125805 A1 | 11/2010 |

OTHER PUBLICATIONS

Notice of Allowance and Fee(s) Due dated Jul. 3, 2012, U.S. Appl. No. 12/642,191, filed Dec. 18, 2009, 16 pages.

International Search Report and Written Opinion of the International Searching Authority dated Aug. 17, 2011, PCT Application No. PCT/US2011/025367 filed Feb. 18, 2011, 16 pages.

Office Action dated Feb. 24, 2012, U.S. Appl. No. 12/642,191, filed Dec. 18, 2009, 16 pages.

Partial International Search Report dated Jun. 8, 2011, PCT Application No. PCT/US2011/025367, filed Feb. 18, 2011.

International Search Report and Written Opinion of the International Searching Authority, dated Jan. 27, 2011, Patent Cooperation Treaty, PCT Application No. PCT/US2010/051666, filed Oct. 6, 2010.

Yang, et al., "The Mechanism of Electroforming of Metal oxide Memristive Switches", Nanotechnology, May 5, 2009, 9 pages, vol. 20, No. 21, IOP Publishing, United Kingdom.

Ha, et al., "Bipolar Switching Characteristics of Nonvolatile Memory Devices Based on Poly(3,4-ethylenedioxythiophene): poly(styrenesulfonate) thin film", Applied Physics Letters, Jul. 22, 2008, 3 pages, vol. 93, No. 3, American Institute of Physics (AIP), Melville, NY, USA.

Do, et al., "Al Electrode Dependent Transition to Bipolar Resistive Switching Characteristics in Pure $TiO_2$ Films", Dec. 9, 2008, Journal of Applied Physics, 4 pages, vol. 104, No. 11, American Institute of Physics (AIP), New York, USA.

English Abstract of Foreign Patent Document WO2010125805, published Nov. 4, 2010, Applicant Panasonic Corp. [JP].

U.S. Appl. No. 12/488,159, filed Jun. 19, 2009.
U.S. Appl. No. 12/642,191, filed Dec. 18, 2009.
U.S. Appl. No. 12/948,375, filed Nov. 17, 2010.
U.S. Appl. No. 12/948,388, filed Nov. 17, 2010.

Kin P. Cheung, "Can TDDB continue to serve as reliability test method for advance gate dielectric?", International Conference on Integrated Circuit Design and Technology, 2004.

Akihito Sawa, "Resistive switching in transition metal oxides", materialstoday, Jun. 2008, vol. 11, No. 6.

You-Lin Wu, et al., "The Degradation of Thin Silicon Dioxide Film Subjected to Pulse Voltage Stresses at Nanoscale", Dielectrics for Nanosystems 4: Materials Science, Processing, Reliability, and Manufacturing, vol. 28, Issue 2—Apr. 25-30, 2010.

\* cited by examiner

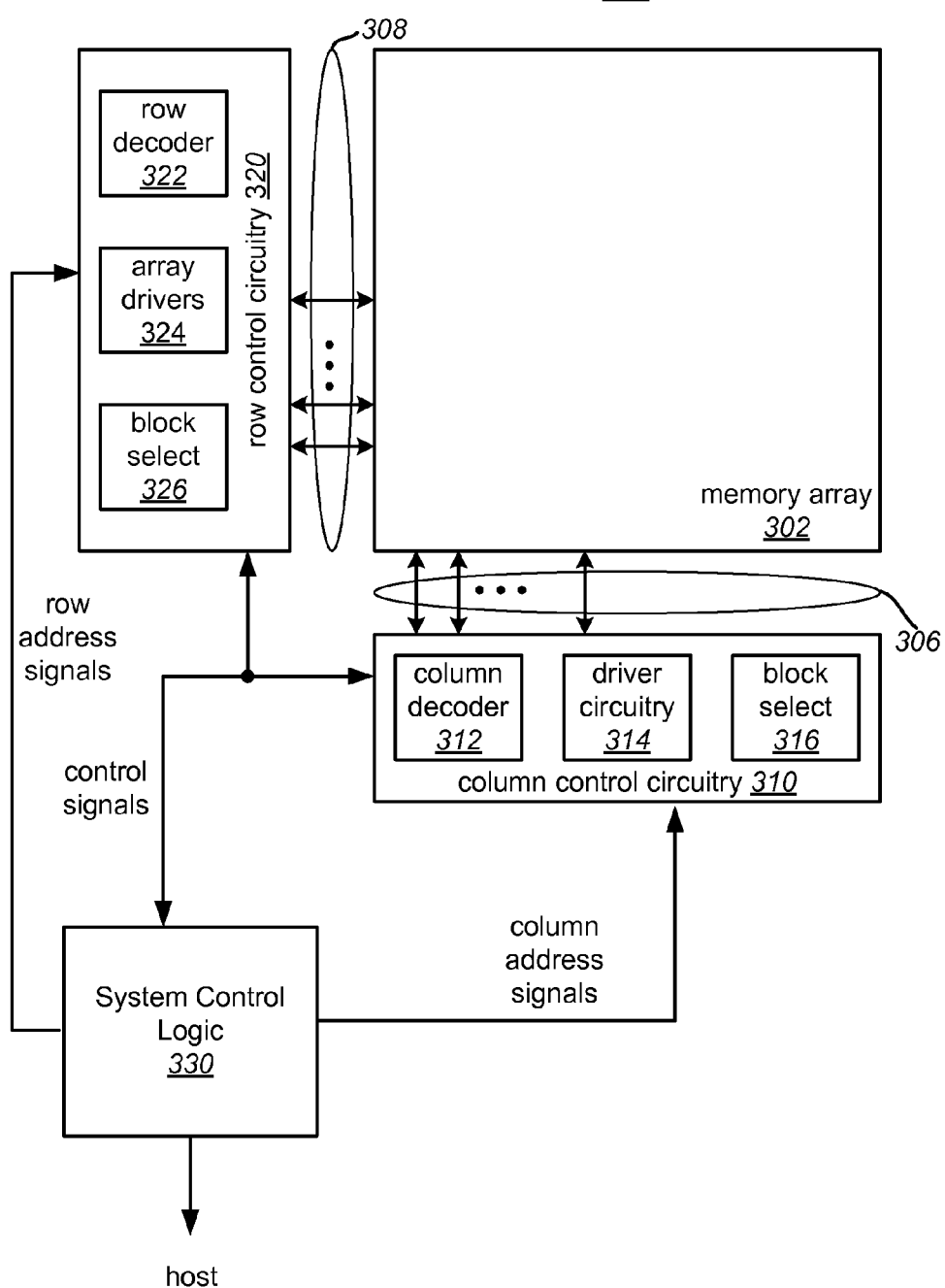

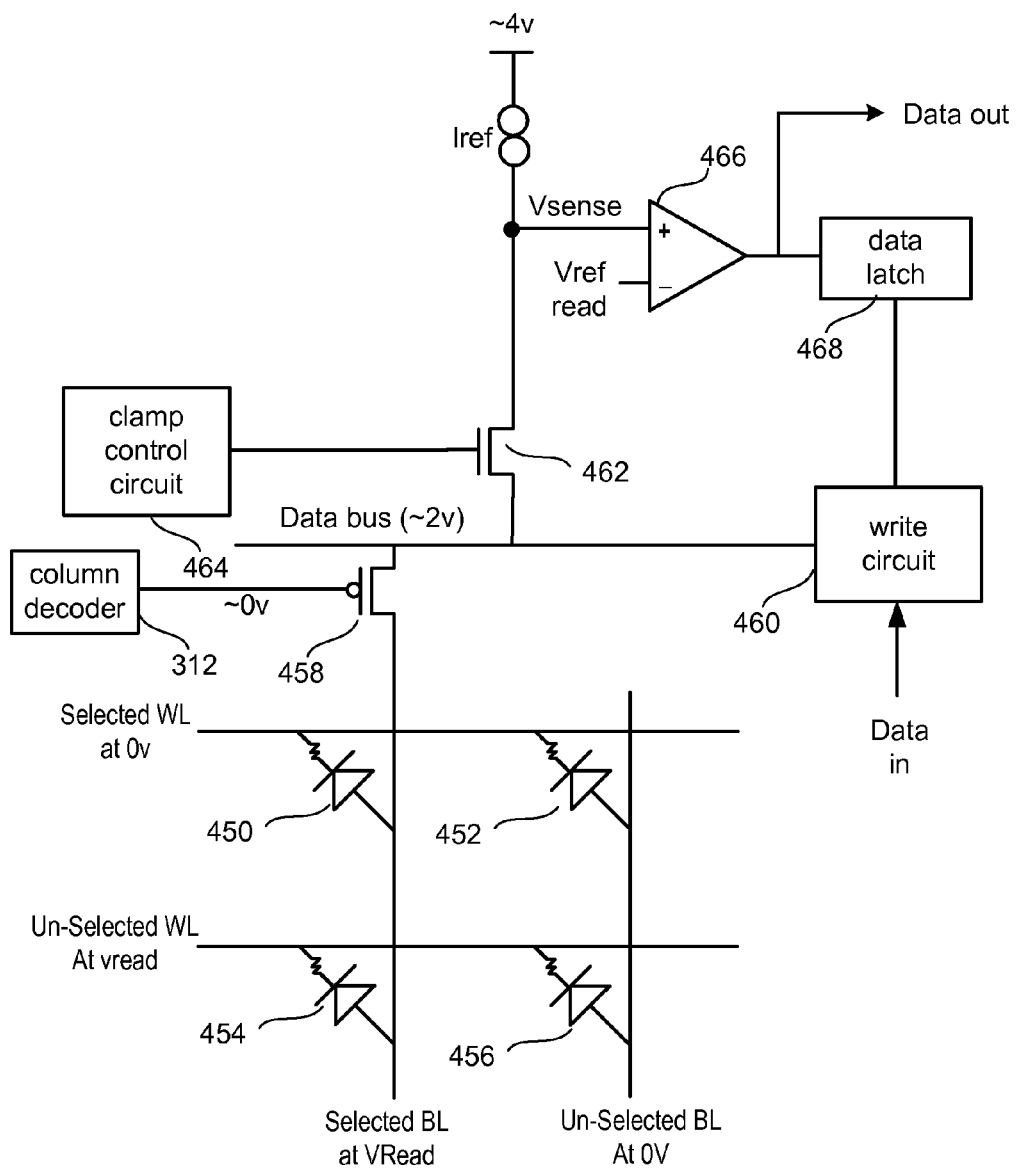

STEP SOFT PROGRAM FOR REVERSIBLE RESISTIVITY-SWITCHING ELEMENTS

PRIORITY

This application claims the benefit of U.S. Provisional Application No. 61/307,245, entitled "STEP INITIALIZATION FOR FORMING REVERSIBLE RESISTIVITY-SWITCHING ELEMENTS," by Chen et al., filed on Feb. 23, 2010, incorporated herein by reference.

BACKGROUND

1. Field

This application relates to technology for non-volatile data storage.

2. Description of the Related Art

A variety of materials show reversible resistivity-switching behavior, and as such may be suitable as use for memory elements. One type of material having reversible resistivity-switching behavior is referred to as resistance change memory (ReRAM). Transition metal oxides have been proposed for ReRAM. Upon application of sufficient voltage, current, or other stimulus, the reversible resistivity-switching material switches to a stable low-resistance state, which is sometimes referred to as SETTING the device. This resistivity-switching is reversible such that subsequent application of an appropriate voltage, current, or other stimulus can serve to return the reversible resistivity-switching material to a stable high-resistance state, which is sometimes referred to as RESETTING the device. This conversion can be repeated many times. The low resistance state is sometimes referred to as an "on" state. The high resistance state is sometimes referred to as an "off" state. For some switching materials, the initial state is low-resistance rather than high-resistance.

These switching materials are of interest for use in non-volatile memory arrays. One type of memory array is referred to as a cross-point array, which is a matrix of memory elements typically arranged along x-axes (e.g., word lines) and along y-axes (e.g., bit lines). A digital value may be stored as a memory resistance (high or low). The memory state of a memory cell can be read by supplying appropriate voltages to the bit line and word line connected to the selected memory element. The resistance or memory state can be read as an output voltage of the bit line connected to the selected memory cell. One resistance state may correspond to a data "0," for example, while the other resistance state corresponds to a data "1." Some switching materials may have more than two stable resistance states.

One theory that is used to explain the switching mechanism is that one or more conductive filaments are formed by the application of a voltage to the memory cell. For example, with a metal oxide switching element, the conductive filaments may comprise one or more chains of oxygen vacancies. The conductive filaments lower the resistance of the memory cell. This initial lowering of the resistance may be referred to as "FORMING." Application of another voltage may rupture the conductive filaments, thereby increasing the resistance of the memory cell. The rupture of the filaments is sometimes referred to as "RESETTING." Application of another still another voltage may repair the rupture in the conductive filaments, thereby decreasing the resistance of the memory cell once again. The repair of the rupture of the filaments is sometimes referred to as "SETTING."

Herein any of the operations of FORMING, RESETTING and SETTING may be considered to be a programming operation. After a programming operation on a group of memory cells, it may be desirable for the group to have a tight resistance distribution. However, some conventional techniques do not achieve a tight resistance distribution. For example, after a programming operation that reduces resistance, some memory cells may have a lower resistance than desired.

Some proposed programming techniques may need a high current level to complete the programming operation. This may require higher voltage and current requirements for the supporting circuitry and increase power consumption.

With some proposed techniques, there may be variations in read current level in a single memory cell from one read to the next. For example, some memory cells may exhibit a 2× variation or larger in read current from one read to the next.

BRIEF DESCRIPTION OF THE DRAWINGS

FIG. 2 is a block diagram of one embodiment of a memory system.

FIG. 3 depicts a circuit that can read the state of a memory cell.

DETAILED DESCRIPTION

A method and apparatus for operating non-volatile storage having memory cells with reversible resistivity-switching elements is described herein. Techniques disclosed herein may provide a tight resistance distribution of reversible resistivity memory cells after a programming operation. Techniques may be able to use a lower maximum programming voltage, for at least some of the programming operations. Techniques may be able to use a lower maximum programming current, for at least some of the programming operations. Read instability may be reduced. Endurance performance may be improved.

Techniques disclosed herein may be used when FORMING, RESETTING, or SETTING memory cells. Herein, the term "programming operation" may include, but is not limited to, FORMING, RESETTING, or SETTING. In some embodiments, one or more programming conditions to apply to a memory cell having a reversible resistivity-switching element are determined based on its resistance. The determination of one or more programming conditions may also be based on a pre-determined algorithm that may be based on properties of the memory cell. The one or more programming conditions may include a programming voltage and a current limit. For example, the magnitude of the programming voltage may be based on the resistance. As another example, the width of a programming voltage pulse may be based on the resistance. In some embodiments, a current limit used during programming is determined based on the memory cell resistance. Other programming conditions such as the transition rate of a programming pulse may also be based on the memory cell's resistance.

Memory Cell and System

Figure 1A:
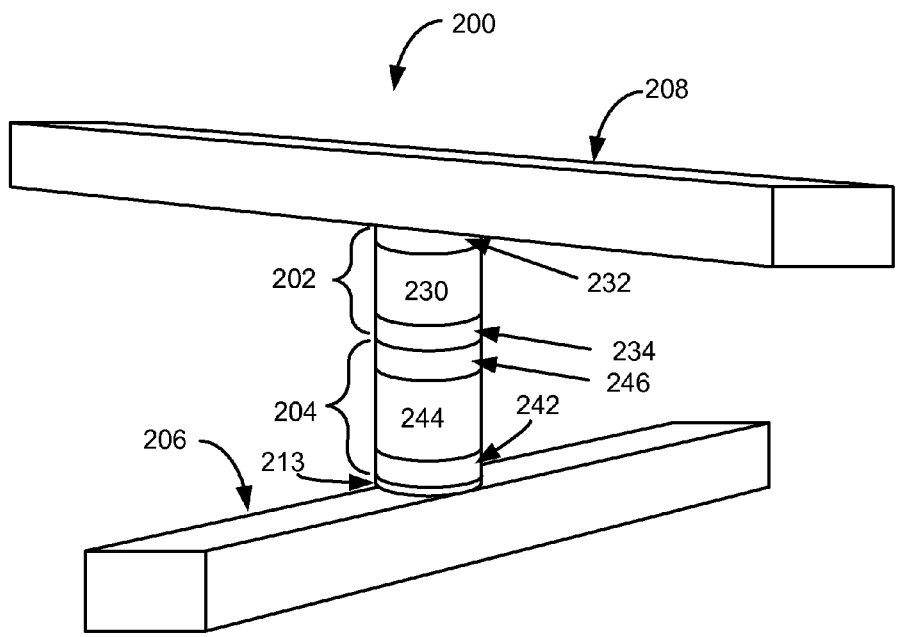
FIG. 1A is a simplified perspective view of one embodiment of a memory cell with a steering element.

Prior to discussing details of programming a memory cell, an example memory cell and system will be discussed. FIG. 1A is a simplified perspective view of one embodiment of a memory cell 200 which includes a reversible resistivity-switching element 202 coupled in series with a steering element 204 between a first conductor 206 and a second conductor 208. In some embodiments, the steering element 204 is a diode. In one embodiment, the diode steering element 204 is a p-i-n diode. In one embodiment, a p-i-n diode includes a p-doped region, an intrinsic region, and an n-doped region. In one embodiment, the diode steering element 204 is a punch-thru diode. A punch-thru diode used as a steering element may be may be a N+/P−/N+ device or a P+/N−/P+ device. In one embodiment, the diode steering element 204 is a Schottky diode. In one embodiment, the diode steering element 204 is a back-to-back Schottky diode. In some embodiments, diode 204 may be formed from a polycrystalline semiconductor material such as polysilicon, germanium, or another semiconductor. Also, the diode steering element 204 may comprise more than one type of semiconductor. For example, diode 204 may be formed from a polycrystalline silicon-germanium alloy, polygermanium or any other suitable combination of semiconductors. In some embodiments, each region 242, 244, 246 of the diode steering element 204 is formed from the same material (but doped differently). However, it is not required that each region be formed from the same material. For example, a heterostructure may be possible.

However, the steering element 204 is not limited to being a diode. In one embodiment, the steering element 204 is a transistor. For example, a Field Effect Transistor (FET) can be used for the steering element 204. FIG. 1E, which will be discussed later, depicts a schematic of a part of a memory array in which the steering element 204 is an FET.

The memory cell 200 has a memory element 202 that includes a reversible resistivity-switching material 230, an upper electrode 232, and a lower electrode 234. Electrode 232 is positioned between reversible resistivity-switching material 230 and conductor 208. In one embodiment, electrode 232 is made of TiN. Electrode 234 is positioned between reversible resistivity-switching material 230 and steering element 204. In one embodiment, electrode 234 is made of titanium nitride, and may serve as a barrier layer.

The memory cell 200 has an electrode 213 at the bottom of the memory cell 200 to facilitate electrical contact between the steering element 204 and other circuit elements. In one embodiment, electrode 213 is formed from TiN. Note that the relative positions of the steering element 204 and the memory element 202 could be reversed. For example, the steering element 204 could be above the memory element 202.

Reversible resistivity-switching element 202 includes reversible resistivity-switching material 230 having a resistance that may be reversibly switched between two or more states. For example, the reversible resistivity-switching material may be in an initial high-resistance state upon fabrication that is switchable to a low-resistance state upon application of a first physical signal. For example, the reversible resistivity-switching element 202 may switch states in response to application of a first amount of energy, charge, heat, voltage, current or other phenomena. Application of a second amount of energy, charge, heat, voltage, current or other phenomena may return the reversible resistivity-switching material to the high-resistance state. Alternatively, the reversible resistivity-switching element may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used. Numerous reversible resistivity-switching materials and operation of memory cells employing reversible resistivity-switching materials are described, for example, in U.S. Patent Application Publication 2006/0250836, previously incorporated.

In some embodiments, reversible resistivity-switching material 230 may be formed from a metal oxide. Various different metal oxides can be used. The metal-oxide may a transition metal-oxide. Examples of metal-oxides include, but are not limited to, NiO, $Nb_2O_5$, $TiO_2$, $HfO_2$, $Al_2O_3$, $MgO_x$, $CrO_2$, VO, BN, and AlN. In one embodiment, the memory element electrodes 232, 234 are formed from TiN. More information about fabricating a memory cell using reversible resistivity-switching material can be found in United States Patent Application Publication 2009/0001343, filed on Jun. 29, 2007, entitled "Memory Cell that Employs a Selectively Deposited Reversible Resistance Switching Element and Methods of Forming the Same," which is hereby incorporated herein by reference in its entirety.

Conductors 206 and 208 may include any suitable conductive material such as tungsten, any appropriate metal, heavily-doped semiconductor material, a conductive silicide, a conductive silicide-germanide, a conductive germanide, or the like. In the embodiment of FIG. 1A, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

While the reversible resistivity-switching element 202 is shown as being positioned above the steering element 204 in FIG. 1A, it will be understood that in alternative embodiments, the reversible resistivity-switching element 202 may be positioned below the steering element 204.

Figure 1B:
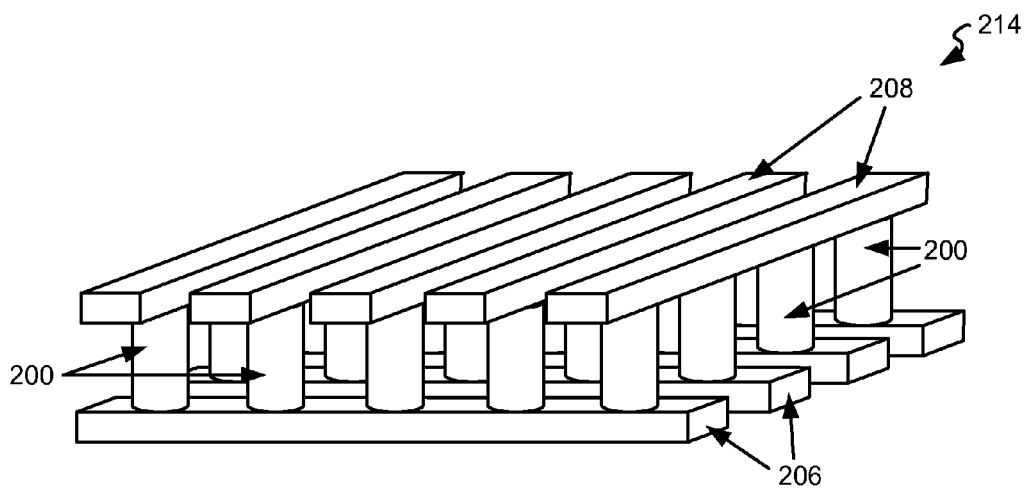
FIG. 1B is a simplified perspective view of a portion of a first memory level formed from a plurality of the memory cells of FIG. 1A.

FIG. 1B is a simplified perspective view of a portion of a first memory level 214 formed from a plurality of the memory cells 200 of FIG. 1A. For simplicity, the reversible resistivity-switching element 202 and the steering element 204 are not separately shown. The memory array 214 is a "cross-point" array including a plurality of first conductors 206 (e.g., bit lines) and a plurality of second conductors 208 (e.g., word lines) between which multiple memory cells are coupled (as shown). Other memory array configurations may be used, as may multiple levels of memory.

Figure 1C:
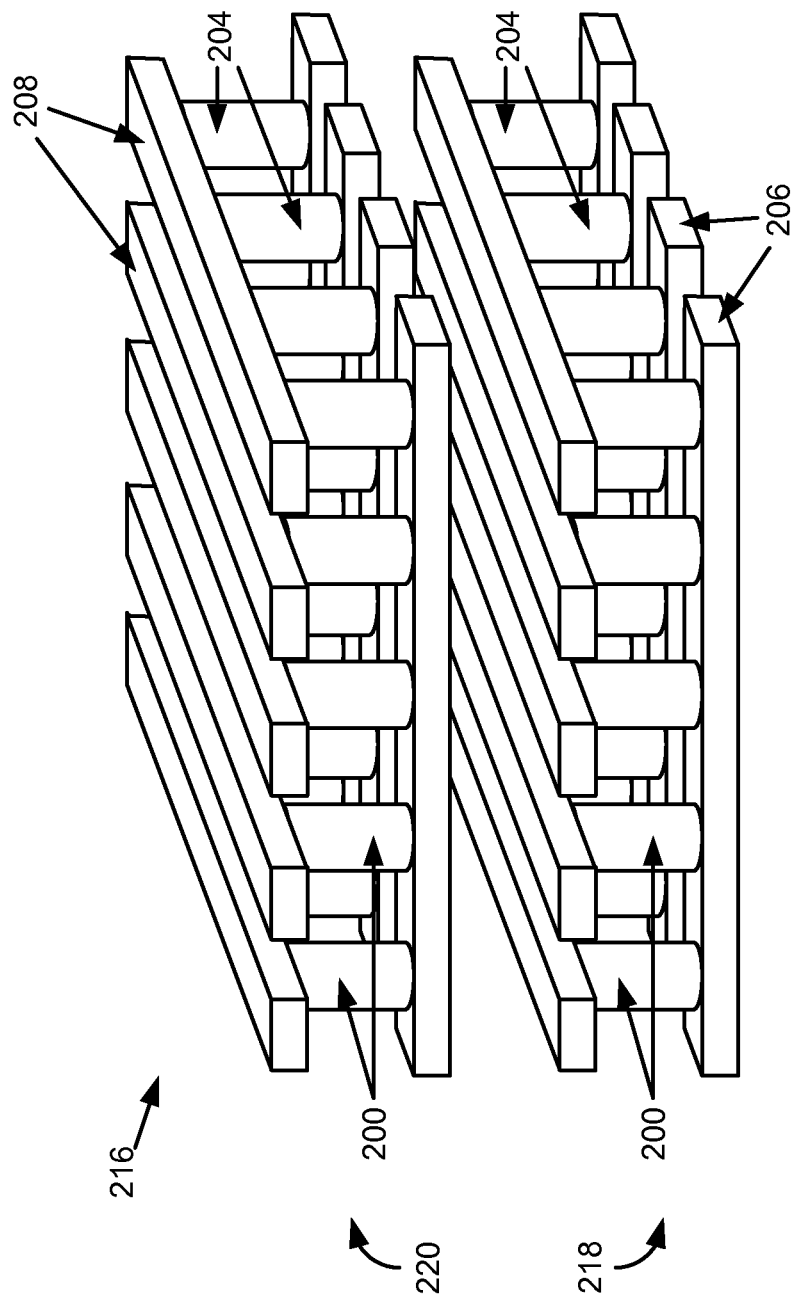
FIG. 1C is a simplified perspective view of a portion of a three dimensional memory array.

FIG. 1C is a simplified perspective view of a portion of a monolithic three dimensional array 216 that includes a first memory level 218 positioned below a second memory level 220. In the embodiment of FIG. 1C, each memory level 218 and 220 includes a plurality of memory cells 200 in a cross-point array. It will be understood that additional layers (e.g., an inter-level dielectric) may be present between the first and second memory levels 218 and 220, but are not shown in FIG. 1C for simplicity. Other memory array configurations may be used, as may additional levels of memory.

Figure 1D:
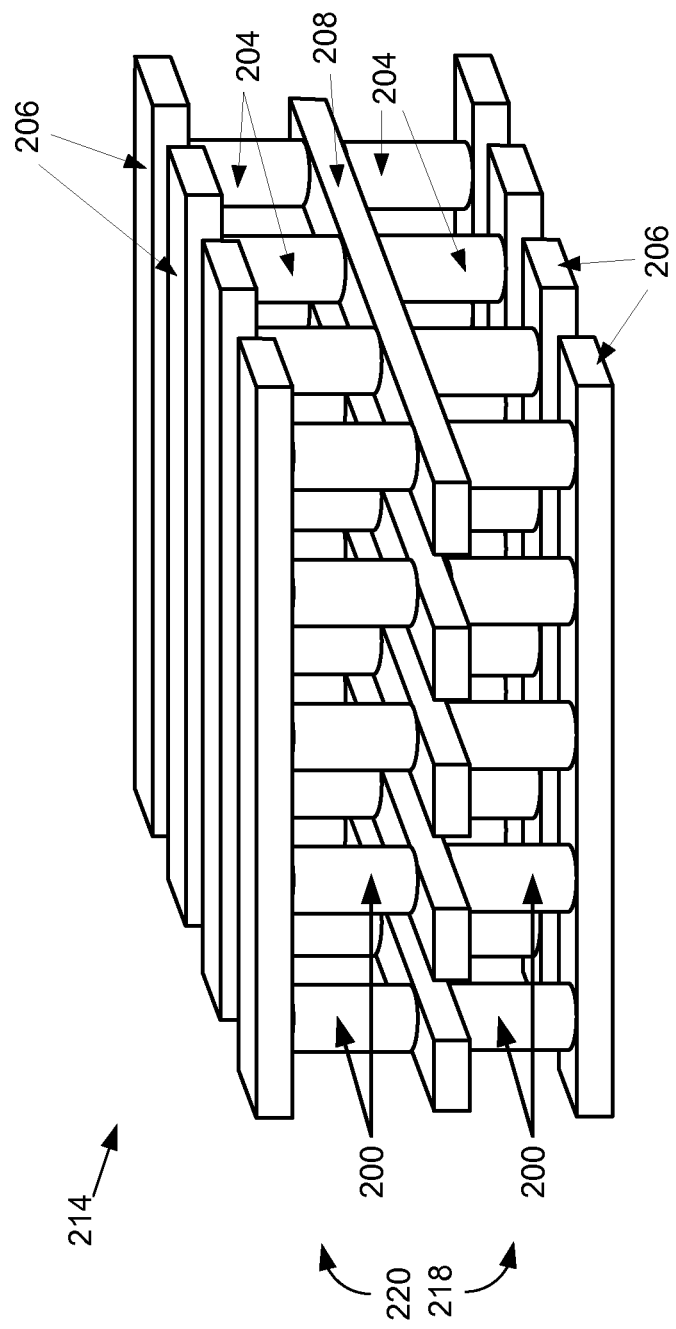
FIG. 1D is a simplified perspective view of a portion of a three dimensional memory array.
Figure 1E:
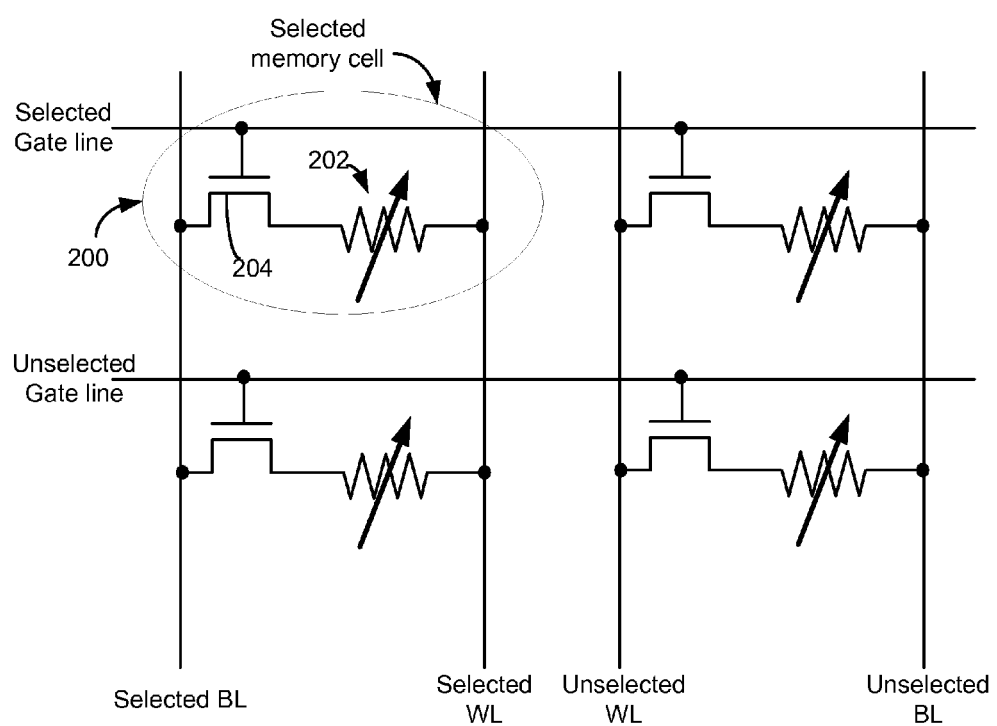
FIG. 1E depicts one embodiment of a portion of a memory array that uses FETs as steering elements.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 1D.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1A-1D show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

As previously mentioned, the steering element 204 is not required to be a diode. FIG. 1E depicts one embodiment of a schematic of a portion of a memory array that uses FETs as steering elements 204. Each memory element 200 includes a reversible resistivity-switching element 202 and a steering element 204, which as stated is an FET. Each memory cell 200 resides between a bit line and a word line. The selected memory cell 200 resides between a selected word line and a selected bit line. The FET of the selected memory cell 200 is connected to the selected gate line. The voltage that is applied to the selected gate line controls the current that is allowed to flow through the reversible resistivity-switching element 202. For example, the gate voltage may be selected to limit the current through the reversible resistivity-switching element 202 to a desired level.

FIG. 2 is a block diagram that depicts one example of a memory system 300 that can implement the technology described herein. Memory system 300 includes a memory array 302 that can be a two or three dimensional array of memory cells as described above. In one embodiment, memory array 302 is a monolithic three dimensional memory array. The array terminal lines of memory array 302 include the various layer(s) of word lines organized as rows, and the various layer(s) of bit lines organized as columns. However, other orientations can also be implemented.

Memory system 300 includes row control circuitry 320, whose outputs 308 are connected to respective word lines of the memory array 302. Row control circuitry 320 receives a group of M row address signals and one or more various control signals from System Control Logic circuit 330, and typically may include such circuits as row decoders 322, array terminal drivers 324, and block select circuitry 326 for both read and programming (e.g., SET and RESET) operations. Memory system 300 also includes column control circuitry 310 whose input/outputs 306 are connected to respective bit lines of the memory array 302. Column control circuitry 306 receives a group of N column address signals and one or more various control signals from System Control Logic 330, and typically may include such circuits as column decoders 312, array terminal receivers or drivers 314, block select circuitry 316, as well as read/write circuitry, and I/O multiplexers. In one embodiment column decoder 312 is a reversible polarity decoder circuit. In one embodiment row decoder 322 is a reversible polarity decoder circuit. In one embodiment, a reversible polarity decoder circuit has active low output in one mode and active high output in another mode. Further details of reversible polarity decoder circuits are described in U.S. Pat. No. 7,542,370, filed on Dec. 31, 2006, which is hereby incorporated herein in its entirety.

System control logic 330 receives data and commands from a host and provides output data to the host. In other embodiments, system control logic 330 receives data and commands from a separate controller circuit and provides output data to that controller circuit, with the controller circuit communicating with the host. System control logic 330 may include one or more state machines, registers and other control logic for controlling the operation of memory system 300.

Integrated circuits incorporating a memory array usually subdivide the array into a number of sub-arrays or blocks. Blocks can be further grouped together into bays that contain, for example, 16, 32, or a different number of blocks. Each block in a 3-D memory may have many layers of memory cells. For example, a block might include 8 layers. Each layer may include hundreds, or thousands of bit lines and word lines. For example, a layer might have about a thousand bit lines and about 8 thousand word lines. In some implementations, there is a bit line driver associated with each bit line. Note that a given driver could be shared between two or more bit lines. Also note that it is not required that a given bit line have only one driver associated therewith. In some implementations, some of the drivers are physically located on one end of the bit lines and other drivers on the other end of the bit lines.

As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. An integrated circuit may include one or more than one memory array.

In one embodiment, all of the components depicted in FIG. 2 are arranged on a single integrated circuit. For example, system control logic 330, column control circuitry 310, and row control circuitry 320 are formed on the surface of a substrate and memory array 302 is a monolithic three dimensional memory array formed above the substrate (and, therefore, above system control logic 330, column control circuitry 310 and row control circuitry 320). In some cases, a portion of the control circuitry can be formed on the same layers as some of the memory array 302.

FIG. 3 depicts a circuit that illustrates one embodiment for reading the state of a memory cell. To determine which state the reversible resistance-switching element 202 is in, a voltage may be applied and the resulting current is measured. A higher measured current indicates that the reversible resistance-switching element 202 is in the low-resistivity state. A lower measured current indicates that the reversible resistance-switching element 202 is in the high-resistivity state. FIG. 3 shows a portion of a memory array including memory cells 450, 452, 454 and 456, which may be based on the embodiments of FIGS. 1A, 1B, 1C, and 1D. In this example, the steering element 204 is a diode. Two of the many bit lines and two of the many word lines are depicted. A read circuit for one of the bit lines is depicted to be connected to the bit line via transistor 458, which is controlled by a gate voltage supplied by column decoder 312 in order to select or unselect the corresponding bit line. Transistor 458 connects the bit line to a Data bus. Write circuit 460 (which is part of system control logic 330) is connected to the Data bus. Transistor 462 connects to the Data bus and operates as a clamp device that is controlled by clamp control circuit 464 (which is part of system control logic 330). Transistor 462 is also connected to comparator 466 and reference current supply $I_{REF}$. The output of comparator 466 is connected to a data out terminal (to system control logic 330, a controller and/or a host) and to data latch 468. Write circuit 460 is also connected to data latch 468.

When attempting to read the state of the reversible resistivity-switching element, all word lines are first biased at Vread (e.g., approximately 1.5 volts) and all bit lines are at ground. The selected word line is then pulled to ground. For example purposes, this discussion will assume that memory cell 450 is selected for reading. One or more selected bit lines are pulled to Vread through the data bus (by turning on transistor 458) and the clamp device (transistor 462, which receives ~1.5 volts+Vt). The clamp device's gate is above Vread but controlled to keep the bit line near Vread. Current is pulled by the selected memory cell through transistor 462 from the $V_{SENSE}$ node. The $V_{SENSE}$ node also receives a reference current $I_{REF}$ that is between a high-resistance state current and a low-resistance state current. The $V_{SENSE}$ node moves corresponding to the current difference between the cell current and the reference current $I_{REF}$. Comparator 466 generates a data out signal by comparing the $V_{SENSE}$ voltage to a Vref-read voltage. If the memory cell current is larger than $I_{REF}$, the memory cell is in the low-resistance state and the voltage at $V_{SENSE}$ will be lower than $V_{REF}$. If the memory cell current is smaller than $I_{REF}$, the memory cell is in the high-resistance state and the voltage at $V_{SENSE}$ will be higher than $V_{REF}$. The data out signal from comparator 466 is latched in data latch 468. In some embodiments, the reference current is based on the address of the memory cell.

Figure 4:
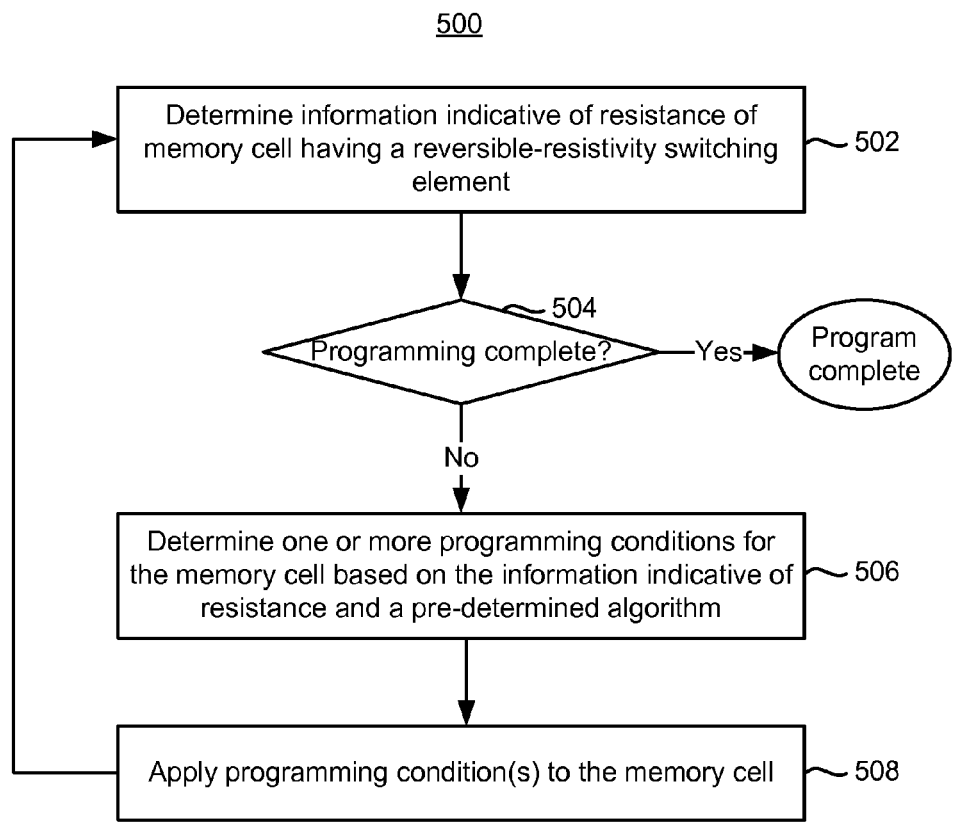
FIG. 4 depicts one embodiment of a process of programming a memory element that has a reversible resistivity switching element.

FIG. 4 is a flowchart of one embodiment of a process 500 of programming non-volatile storage using step initialization. The programming operation may be FORMING, SET or RESET. In the description of process 500, programming of one memory cell is described for ease of explanation. Note that more than one memory cell may be programmed at a time.

In step 502, information indicative of resistance of a memory cell to be programmed is determined. In one embodiment, the information is determined by determining a current that conducts when a read voltage is applied across the memory cell. In some embodiments, step 502 determines what current the memory cell conducts in response to a certain read voltage applied to the memory cell. For example, step 502 may determine which of several current ranges the memory cell's conduction current falls within. Later steps may act on upon this determination of current level. Note, however, that the conduction current is a function of the resistance of the memory cell.

For example, referring to FIG. 3, a voltage Vread may be applied across the memory cell and the current that conducts may be compared to a reference current (e.g., Iref). The resistance of the memory cell may be determined to be higher or lower than a certain resistance based on the comparison.

In step 504, a determination is made whether programming is complete based on the information indicative of resistance. If so, then process 500 ends. For example, if the programming operation is a forming operation, then the memory cell's resistance may be compared to a target resistance for forming. If the memory cell's resistance is less than the target resistance, the forming process may be considered complete. If the programming operation is a reset operation, then the comparison may be with a target reset resistance. If the memory cell's resistance is greater than the target reset resistance, the RESET process may be considered complete. If the programming operation is a SET operation, then the comparison may be with a target SET resistance. If the memory cell's resistance is less than the target set resistance, the SET process may be considered complete. As stated above, the information indicative of resistance may be current. Therefore, the actual comparison may be performed using current levels instead of resistance.

In step 506, one or more programming conditions are determined based on the information indicative of resistance and a pre-determined algorithm, if the programming operation is not yet complete. The pre-determined algorithm may be based on properties of the memory cell. A different algorithm might be used for memory cells having different materials. For example, one algorithm might be used for a memory cell having a metal oxide switching element and another for a memory cell having a carbon switching element. The algorithm may be a function of the memory cell's resistance (or some information indicative of resistance, such as current that results from an applied voltage).

The programming conditions may include, but are not limited to, a programming voltage and a current limit. For example, the magnitude of the programming voltage may be determined based on the resistance and the pre-determined algorithm. As another example, a width of a programming voltage pulse may be determined based on the resistance and the pre-determined algorithm. In some embodiments, the current that is available to the memory cell during programming is limited. The current limit may be determined based on the memory cell's resistance and the pre-determined algorithm. Note that it is not required that all of the aforementioned programming conditions be based on the memory cell's resistance and the pre-determined algorithm. For example, one, two (any combination), or all three of these programming conditions may be based on resistance and the pre-determined algorithm. Also, other programming conditions might also be determined based on the memory cell's resistance and the pre-determined algorithm. For example, other parameters of the programming signal such as its transition rate might be a function of the memory cell's resistance and the pre-determined algorithm. An example of a transition rate is the slope of a voltage pulse.

In step 508, the one or more programming conditions from step 506 is/are applied to the memory cell. Thus, the one or more programming conditions may be a function of the memory cell's resistance. For example, the magnitude and/or pulse width of a programming voltage may be may be a function of the memory cell's resistance. As also noted, the current available to the memory cell while programming may be limited to a value that is determined based on the resistance. The process 500 then returns to step 502 to re-determine the information indicative of resistance of the memory cell. The process 500 may continue until programming is complete. Therefore, with the next iteration, a different set of one or more programming conditions may be applied. Under some circumstances, the same programming condition(s) might be applied in successive iterations of process 500. For example, if the resistance of the memory cell did not change much, then the same programming condition(s) might be applied again. Note that some memory cells might program faster than other memory cells. Therefore, some memory cells might step through the programming process faster than others. In other words, some may take fewer iterations of process 500.

Figure 5A:
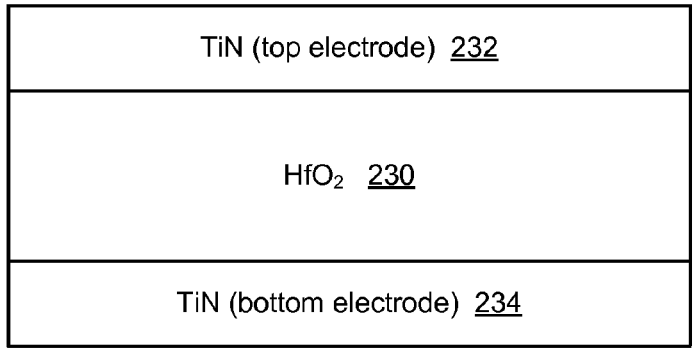
FIGS. 5A, 5B, and 5C are embodiments of memory cells.
Figure 5B:
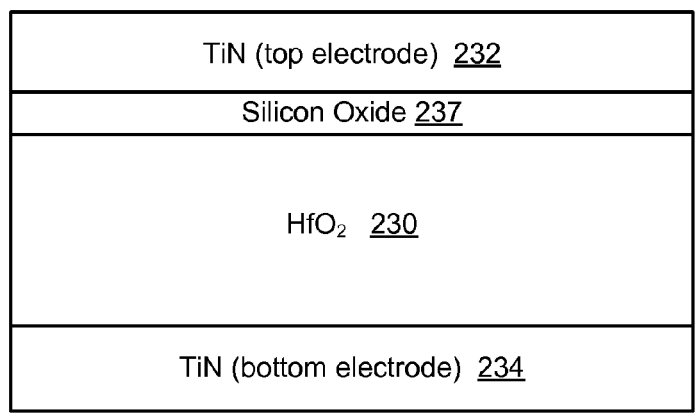
Figure 5C:
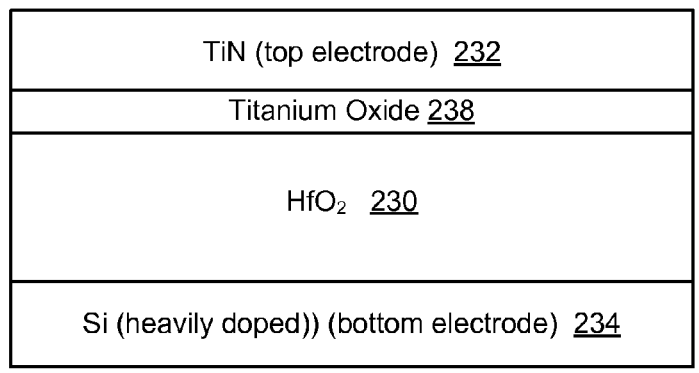

FIGS. 5A, 5B and 5C depict embodiments of memory cells 202 having metal oxide switching elements 230. These examples will be used to help explain why a certain sequence of programming conditions might be used for devices with metal oxides. In other words, why a certain pre-determined algorithm may be used. The general principles of using different programming conditions as programming progresses (e.g., using a different pre-determined algorithm) may be applied to memory cells having materials other than metal oxides.

FIG. 5A depicts one example of materials that might be used in one embodiment of a memory cell 202. The top electrode 232 and bottom electrodes 234 are each TiN. The reversible resistivity switching material 230 is $HfO_2$. Thus, the switching material is metal oxide in this example. However, a different metal oxide may be used.

FIG. 5B depicts one example of materials that might be used in one embodiment of a memory cell 202. As one example, the $HfO_2$ may be about 6-8 nm thick and the silicon oxide ($SiO_2$) may be 1.5-2 nm thick. In some embodiments, the $SiO_2$ layer 237 may be broken down during one or more of the programming steps. Subsequent programming steps may form (or SET) the $HfO_2$ layer 230. For example, programming steps may cause oxygen vacancies to form in the $HfO_2$ layer. Eventually, a chain of oxygen vacancies may be formed from top to bottom of the $HfO_2$ layer 230. However, it may be possible that if the magnitude of the programming voltage pulse is too large that the $HfO_2$ layer 230 itself may be over stressed. The overstress of the $HfO_2$ layer 230 may damage the memory cell 202. In some embodiments, the magnitude of the programming voltage is reduced as SETTING (or FORMING) proceeds such that overstress of the metal oxide layer 230 may be avoided.

Note that the top and bottom electrodes are not required to be the same material. FIG. 5C depicts an embodiment of a memory cell 202 in which the bottom electrode 234 is heavily doped silicon and the top electrode is TiN. In this embodiment, there is an optional region of titanium oxide 238 between the $HfO_2$ layer 230 and the top electrode 232.

Note that techniques for programming that are disclosed herein are not limited to metal oxide switching elements. For other materials, different programming conditions might be established than for metal oxides. An example of programming carbon based switching elements is discussed below.

Figure 6A:
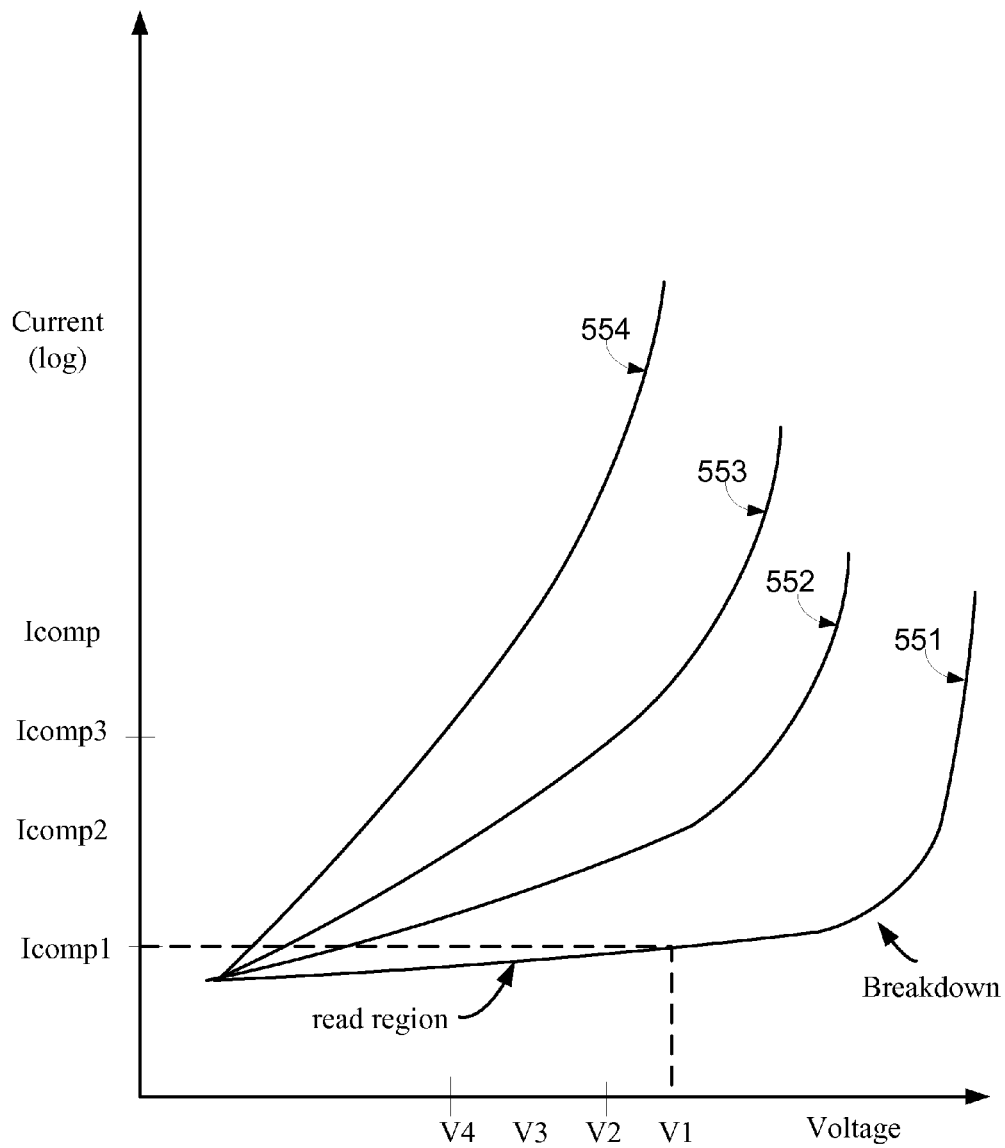
FIG. 6A is a graph depicting examples of current-voltage (I-V) relationships when SETTING example memory cells.

FIG. 6A is a graph depicting examples of current-voltage (I-V) relationships when SETTING example memory cells. The example curves may be for one embodiment in which the switching element is metal oxide. These I-V curves will be used to help explain why certain programming conditions might be used. If the switching element is a different type of material, the I-V curves may have a different shape. Therefore, different programming conditions might be used for different materials.

The graph depicts four I-V curves, 551-554. Each curve represents a different stage of the SETTING process for the example memory cell. For at least some portion of the curves, the slope of an I-V curve may be used to approximate the conductance of the memory cell. For example, there may be what is referred to herein as an "read region" for the curves at lower voltages. However, there may be some breakdown that occurs at higher voltages. For some embodiments, the switching material may be operated close to or in the break down region during programming. Note at breakdown the current may increase dramatically. As an example, for the lower voltages of curve 551, the conductance of the memory cells may be approximated based on the slope of the I-V curve. Since some of the voltage may appear across other circuit elements (e.g., steering element, bit line, word lines), which should be factored in. A possible reason for the breakdown at higher voltages is that the metal oxide of the memory cell may break down at higher voltages. There may be other reasons for the breakdown. For some memory cells it may be desirable to keep the programming voltage in the read region during programming in order to avoid breakdown of the metal oxide. A possible reason for this is that voltage breakdown of the metal oxide may be damaging to the memory cell.

One I-V curve 551 may represent an I-V relationship for the beginning of the SETTING process, when the resistance of the memory cell is high. Another curve 552 may represent an I-V relationship after at least one programming signal has been applied, and therefore, the resistance of the memory cell is lower. The third and fourth curves (553, 554) may represent later stages of the SETTING process when the resistance of memory cell is still lower. As can be seen from the curves 551-554, the slope of the read region increases as the SET- TING operation proceeds. Moreover, the breakdown region occurs at a lower programming voltage as the memory cell's resistance decreases.

In some embodiments, the magnitude of the programming voltage that is used during SET is reduced as the memory cell's resistance drops. Four example voltages V1-V4 are depicted. As to foregoing discussion illustrates, this may help to prevent entering a breakdown region of the memory cell for some devices.

During some embodiments of programming, the current that is available to the memory cell during programming is limit. This current limit may be referred to herein as "Icomp." Reference will be made again to FIG. 6A to explain why this may be beneficial for some devices. If a voltage V1 is applied to a memory cell, then it will tend to move the memory cell to a curve having a lower resistance. For example, say a memory cell has a resistance that would put it on the read region of curve 551. If the voltage V1 is applied, this could move the memory cell's resistance towards a curve such as 552 or 553. However, note that the breakdown voltage occurs at a lower voltage for curves 553 than for curve 552. Thus, if the memory cell's resistance were to drop too much as a result of applying V1, voltage breakdown could occur. However, limiting the current to Icomp1 can help to prevent the memory cell's metal oxide from voltage breakdown. In other words, the memory cell might be moved to curve 552, but might be prevented from moving to curve 553. Four example compensation currents Icomp1-Icomp4 are depicted. In one embodiment, Icomp1 is used when V1 is used, Icomp2 with V2, etc.

Figure 12A:
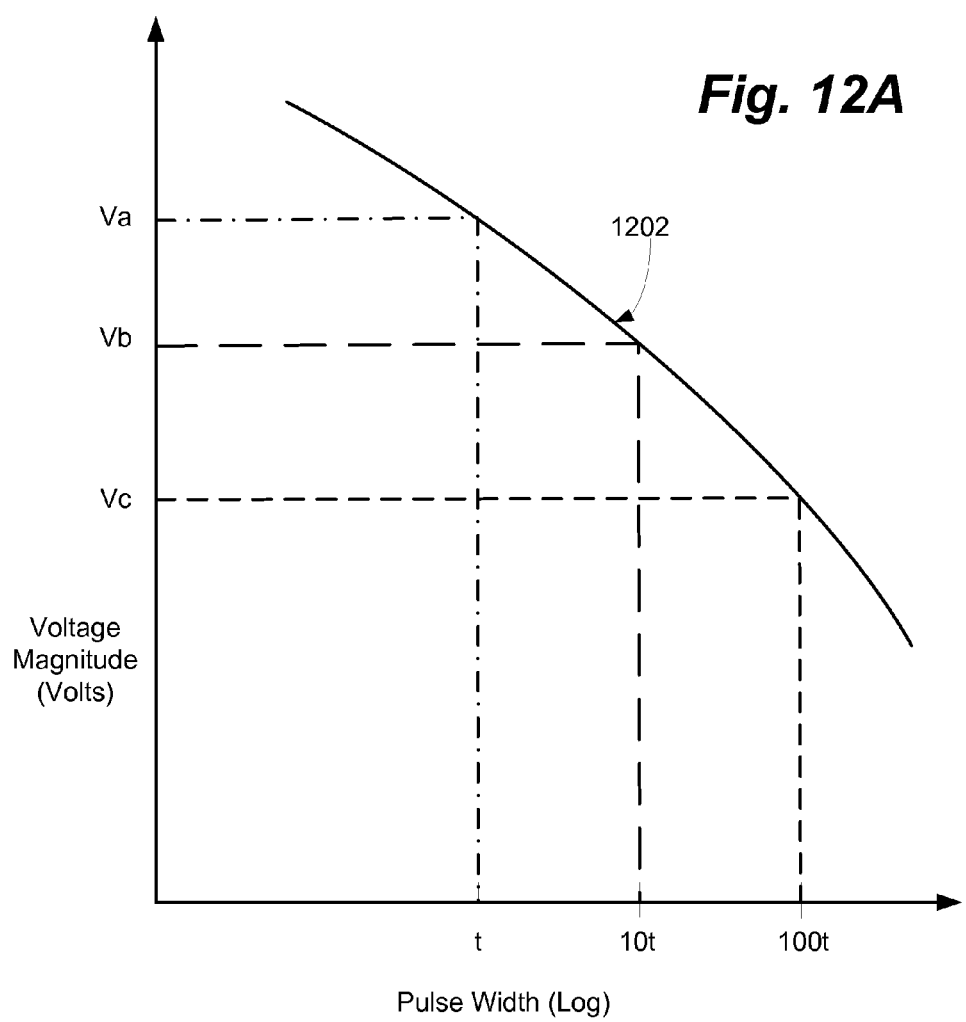
FIG. 12A is a graph of one embodiment of a relationship between programming voltage magnitude and programming voltage pulse width.

In some embodiments, the programming signal is a pulse having a magnitude and a width. For at least some memory cells 200, there may be a relationship between the voltage magnitude and pulse width. For example, if a more narrow pulse width is used, then a larger magnitude voltage might be used to achieve the same change in memory cell resistance. FIG. 12A is a graph of relationship a voltage magnitude versus pulse width for one embodiment. The curve 1202 represents points that may achieve about the same programming effect (e.g., change in memory cell resistance). For example, for a pulse width of "t", the voltage Va may achieve a given programming effect. For a pulse with 10t, the voltage Vb may be used. For a pulse with 100t, the voltage Vc may be used. Therefore, for longer pulse widths, a lower programming voltage might be used. For some embodiments, the relationship may be about 0.25V per decade. However, different materials may exhibit different relationships.

Figure 12B:
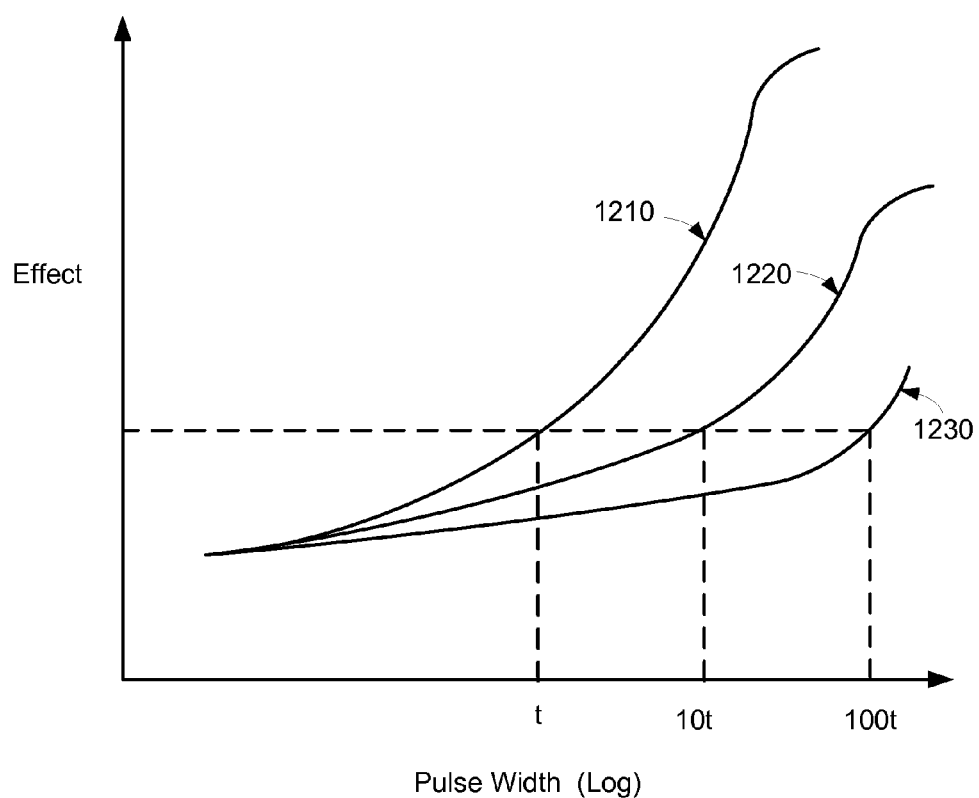
FIG. 12B is a graph of one embodiment of a relationship between programming effect and programming voltage pulse width with constant voltage magnitude.

FIG. 12B shows a relationship between programming voltage and pulse width in another manner. In FIG. 12B, each curve represents one programming voltage magnitude. For example, curve 1230 might correspond to Vc in FIG. 12A, curve 1220 might correspond to Vb in FIG. 12A, and curve 1210 might correspond to Va in FIG. 12A. As can be seen, the same programming effect might be achieved using different pulse widths, by appropriate selection of voltage magnitude.

One way of explaining benefits of programming based on memory cell resistance and an algorithm is that the power level delivered to the memory cell is more consistent. For example, as the current level increases, the reduced voltage level (and/or shorter pulse widths) may provide a more constant power level from programming pulse to programming pulse.

The foregoing discussion points out that various properties of the memory cell may affect what programming conditions should be used as the programming operation progresses. Thus, the properties of the memory cell may affect the characteristics that the pre-determined algorithm used during programming should have.

Figure 6B:
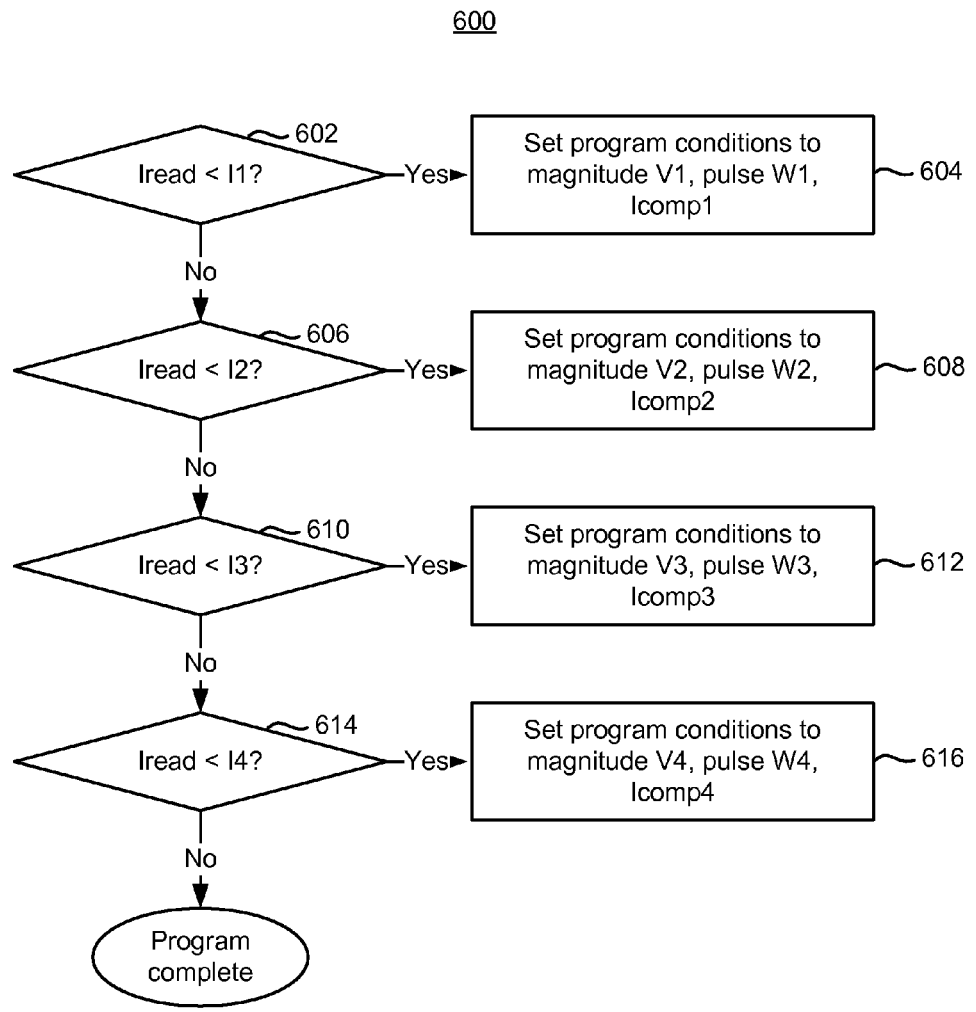
FIG. 6B is a flowchart of one embodiment of a process of determining one or more programming conditions when lowering a memory cell's resistance.

FIG. 6B is a flowchart of one embodiment of a process 600 of determining one or more programming conditions for a memory cell based on the memory cell's resistance (and a pre-determined algorithm). Process 600 also determines whether the programming operation is complete. Thus, process 600 is one embodiment of steps 504-506 of FIG. 4. In one embodiment, process 600 is used when FORMING a memory cell. In one embodiment, process 600 is used when SETTING a memory cell. The process 600 may be used for metal oxide switching elements, carbon switching elements, or another type of switching element. The example I-V curves of FIG. 6A will be used to help explain process 600. However, note that process 600 is applicable to devices having different types of I-V curves.

In process 600, the conduction current of the memory cell is used to make the resistance determination. As noted above, the conduction current may be a function of the memory cell's resistance. For example, referring to FIG. 3, the voltage Vread may be applied across the memory cell during a read operation. A portion of this voltage may also be across the steering element and the selected word line and bit line.

In process 600, the conduction current of the memory cell (Iread) is compared to four different reference currents. In one embodiment, four different read operations are performed with memory cell conduction current being compared to a different reference current (I1-I4) each time. The circuitry of FIG. 3 may be used to test for a different reference current with each read operation. In one embodiment, a single read operation is performed with the conduction current being compared to four different reference currents. The circuitry of FIG. 3 may be modified test for four different reference currents during the same read operation.

In general, process 600 describes a flow in which the memory cell conduction current after applying a programming pulse (or possibly before programming has started) is compared to a reference current. The first test in process 600 may correspond to a test to determine whether the memory cell's conduction current is very low, which corresponds to a high resistance.

In general, process 600 compares the memory cell's conduction current (Iread) to up to four different reference levels (see steps 602, 606, 610, 614). A different number of reference current levels could be used. The process 600 is described in the order in which a memory cell may experience programming. Process 600 is used when the programming operation is being used to lower the memory cell's resistance. Therefore, the first test (step 602) is for a relatively low current, which corresponds to a relatively high resistance. The following steps are for higher and higher currents (lower and lower resistances). Note that the order in which the tests (steps 602, 606, 610, and 614) are performed may be arbitrary.

Process 600 refers to four different programming voltage magnitudes V1-V4. Each programming voltage corresponds to one of the conduction reference currents (I1-I4). In one embodiment, as the memory cell's resistance is lowered to the next level, the magnitude of the programming voltage may become smaller. However, the programming voltages V1-V4 could have any relationship with one another.

Process 600 refers to four different programming voltage pulse widths width 1-width 4. These also correspond to one of the conduction currents (I1-I4). In one embodiment, as the memory cell's resistance is lowered, pulse widths of the programming voltage become wider. However, each successive pulse width could be narrower instead. In one embodiment, each pulse has the same width. The pulse widths could have any relationship with one another.

Process 600 refers to four different programming current limits (Icomp1-Icomp4). These also correspond to one of the conduction reference currents (I1-I4). In one embodiment, as the memory cell's resistance is lowered, the programming current limit become greater. However, each successive current limit could be smaller instead. In one embodiment, each current limit is the same. The programming current limits could have any relationship to the memory cell's resistance.

The sequence of voltage magnitudes, pulse widths, and programming current limits may be considered to be a predetermined algorithm. The various values for the programming conditions may be stored in a table in control logic or in non-volatile storage elements on the memory device. The algorithm may be selected by exercising a set of groups of cells on the memory device, where each group in the set is given a different algorithm by test control hardware and an algorithm is selected by the test control hardware and coded into the non-volatile memory bits on the chip.

In step 602, a determination is made whether the conduction current (Iread) is greater than a first reference current (I1). As noted, I1 may be a fairly low reference current that is designed to test for relatively high resistance. If Iread is smaller than I1, then step 604 is performed to establish one or more programming conditions. In other words, if the memory cell resistance is higher than the relatively high resistance being tested for, then step 604 is performed.

In step 604, the program signal may be set to voltage magnitude V1. In one embodiment, V1 will be the highest magnitude program voltage that is used in process 600. The pulse width may be set to W1. In one embodiment, W1 will be the narrowest width that is used in process 600. The current limit may be set to Icomp1. In one embodiment, the current limit will be the smallest current limit that is used in process 600. Process 600 completes if step 604 is performed. Then, step 508 of FIG. 4 may be performed to apply the one or more programming conditions.

If the conduction current (Iread) is not less than the first reference current (I1), then the conduction current (Iread) is compared to a second reference current (I2). The second reference current (I2) may be greater than the first (I1), such that a lower resistance is being tested for. If the conduction current (Iread) is less than I2, one or more programming conditions are established in step 608. The program signal may be set to voltage magnitude V2. In one embodiment, V2 is less than V1. The pulse width may be set to W2. In one embodiment, the W2 is narrower than W1. Note that both the voltage magnitude and width may change during the process. Alternatively, one might change and the other stays fixed (for at least some steps.) For example, as resistance becomes lower, the memory cell might need a smaller voltage to further reduce the resistance. If the operation voltages are kept the same as resistance drops, a narrower pulse width may be used to provide a smaller effective voltage, which is shown in FIG. 12A The current limit may be set to Icomp2. Icomp2 may be greater than Icomp1. The process 600 is then done. Next, step 508 of FIG. 4 may be performed to apply the programming signal.

If the conduction current (Iread) is not less than the second reference current (I2), then the conduction current (Iread) is compared to a third reference current (I3). If the conduction current (Iread) is less than I3, then one or more programming conditions is established in step 612. The program signal may be set to voltage magnitude V3. In one embodiment, V3 is less than V2. The pulse width may be set to W3. In one embodiment, the W3 is narrower than W2. The current limit may be set to Icomp3. Icomp3 may be greater than Icomp2. The process 600 is then done. Next, step 508 of FIG. 4 may be performed to apply the programming signal.

If the conduction current (Iread) is not less than the third reference current (I3), then the conduction current (Iread) is compared to a fourth reference current (I4). If the conduction current (Iread) is less then than I4, then one or more programming conditions is established in step 616. The program signal may be set to voltage magnitude V4. In one embodiment, V4 is less than V3. The pulse width may be set to W4. In one embodiment, the W4 is narrower than W3. The current limit may be set to Icomp4. Icomp4 may be greater than Icomp3. The process 600 is then done. Next, step 508 of FIG. 4 may be performed to apply the programming signal.

If the conduction current (Iread) is not less than the fourth reference current (I4), then this indicates that no further programming is necessary. In other words, the resistance of the memory cell has been reduced to the target level. Therefore, this condition is one embodiment of step 504 of FIG. 4.

Figure 7A:
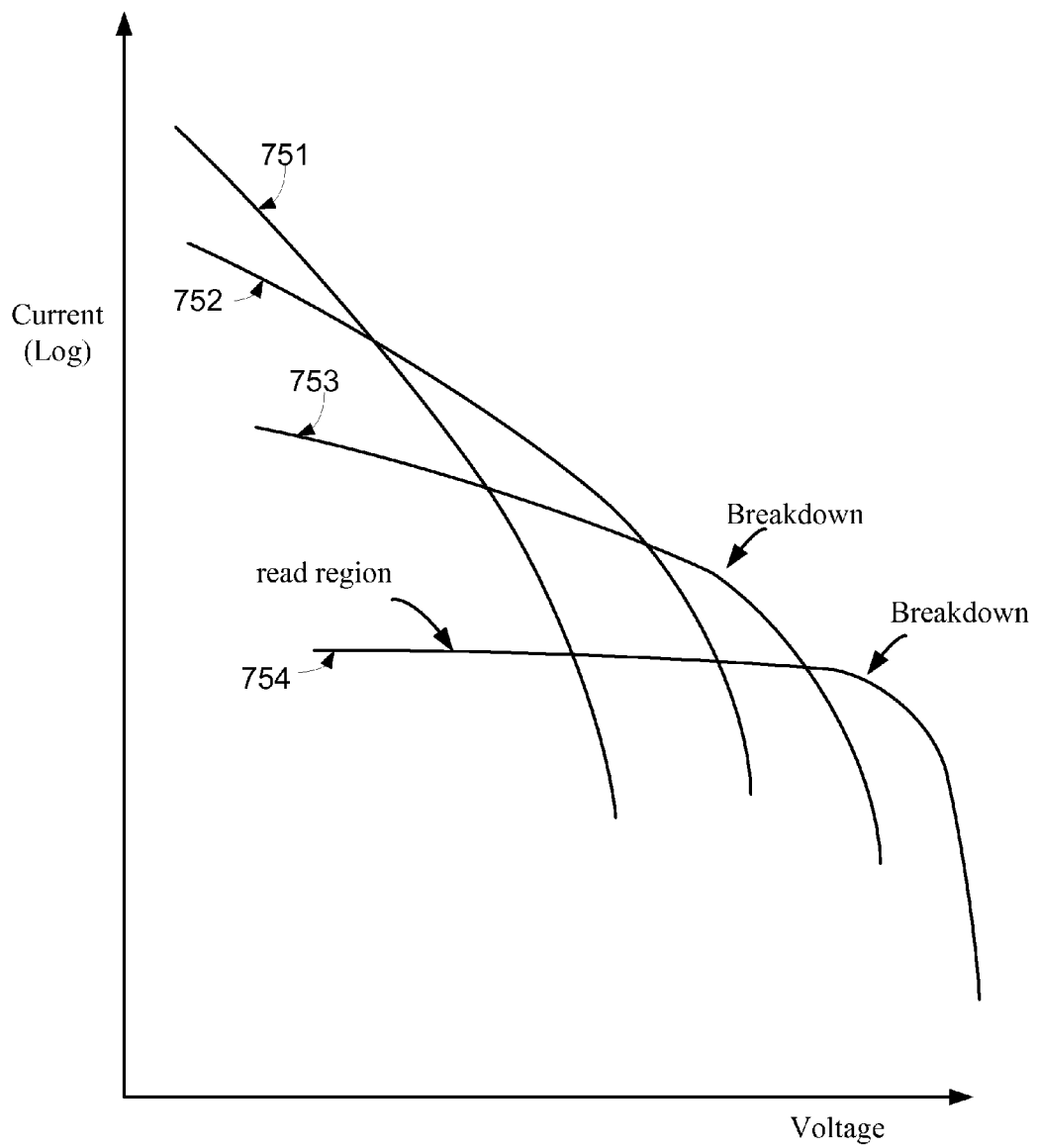
FIG. 7A is a graph depicting examples of current-voltage (I-V) relationships when RESETTING example memory cells.

FIG. 7A is a graph depicting examples of current-voltage (I-V) relationships when RESETTING example memory cells. The example may correspond to one embodiment in which the switching element is a metal oxide. Note that different types of memory cells may have different I-V relationships. For example, if the switching element were carbon, the I-V curves could be different than the example of FIG. 7A. Also note that different types of metal oxides may exhibit different characteristics. Also the other elements of the memory cell, such as the steering element may affect the shape of the curves. Also note that some memory cells may have a region of silicon oxide that may affect the shape of the I-V curve.

The graph depicts four I-V curves, 751-754. Each curve represents a different stage of the RESETTING process for the example memory cell. For at least some portion of the curves, the slope of an I-V curve may be used to approximate the conductance of the memory cells. However, there may be some breakdown that occurs at higher voltages. For example, for the lower voltages of curve 751, the conductance of the memory cell may be approximated based on the slope of the I-V curve. Since some of the voltage may appear across other circuit elements (e.g., steering element, bit line, word lines), this should be factored in. A possible reason for the breakdown at higher voltages is that the metal oxide of the memory cell may break down at higher voltages. For some memory cells it may be desirable to keep the programming voltage below the hard break down region during programming in order to avoid complete breakdown of the metal oxide. A reason for this is that voltage breakdown of the metal oxide may be damaging.

One curve 751 represents an I-V relationship for the beginning of the RESETTING process, when the resistance of the memory cell is low (as indicated by relatively high slope in read region). Another curve 752 represents an I-V relationship after at least one programming signal has been applied, and therefore, the resistance of the memory cell is higher (as indicated by slightly lower slope in the read region). The third and fourth curves (753, 754) represent later stages of the RESETTING process when the resistance of memory cell is still higher. As can be seen from the curves 751-754, the slope of the read region decreases as the RESETTING operation proceeds. Moreover, the breakdown region occurs at a higher programming voltage, as the memory cell's resistance increases.

In some embodiments, the magnitude of the programming voltage that is used during RESET is increased as the memory cell's resistance increases. This may help to prevent entering the breakdown region.

Also note that the Icomp may be adjusted to prevent the memory cell from reducing resistance too fast. This may also help to prevent from entering the breakdown region. For example, Icomp may be decreased during the RESET process.

Figure 7B:
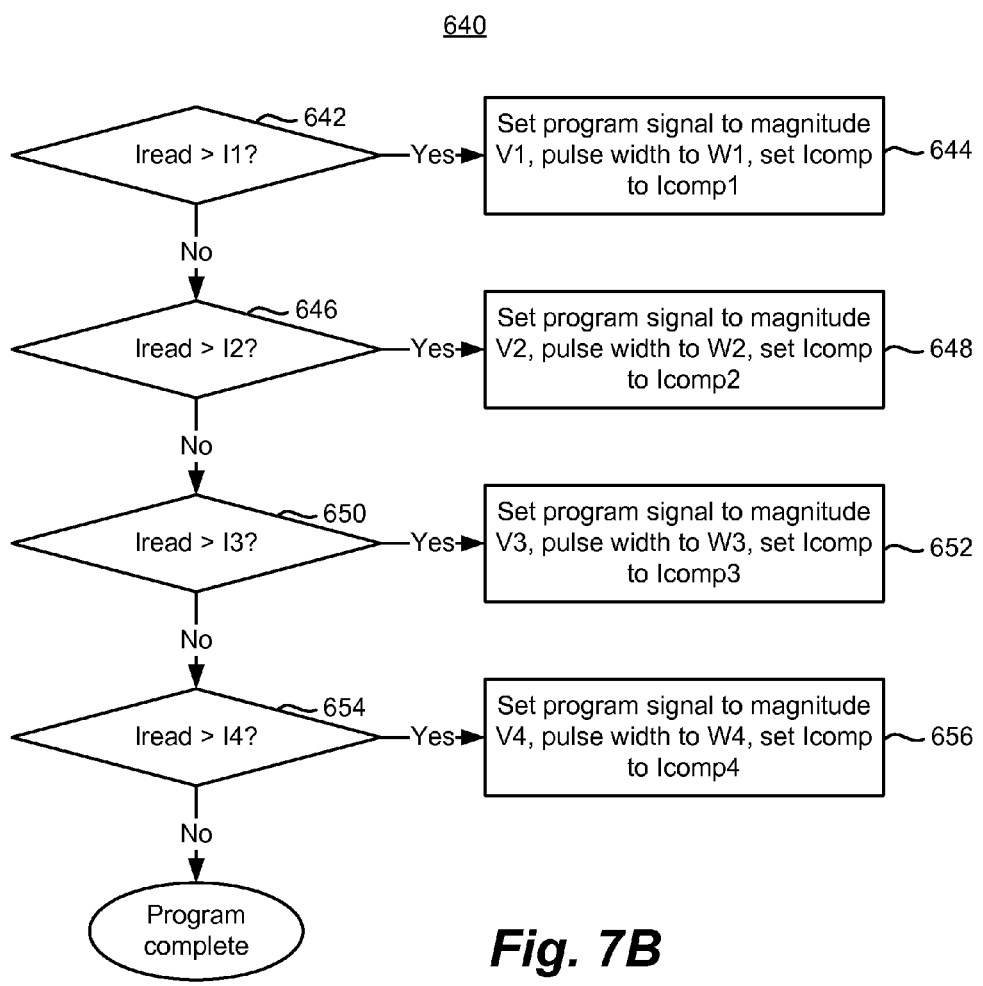
FIG. 7B is a flowchart of one embodiment of a process of determining one or more programming conditions when increasing a memory cell's resistance.

FIG. 7B is a flowchart of one embodiment of a process 640 of determining a programming signal for a memory cell based on the memory cell's resistance. Process 640 may be used during a programming operation that increases the memory cell's resistance. In one embodiment, process 640 is used when RESETTING a memory cell. However, process 640 is not limited to RESET. Process 640 also determines whether the programming operation is complete. Thus, process 640 is one embodiment of steps 504-506 of FIG. 4.

In general, process 640 describes a flow in which the memory cell conduction current after applying a programming pulse (or possibly before programming has started) is compared to a reference current. The first test may correspond to a test to determine whether the memory cell's conduction current is very high, which corresponds to a low resistance.

In general, process 640 compares the memory cell's conduction current (Iread) to up to four different reference levels (I1-I4). Note that these are not the same reference currents from process 600. The process 640 is described in the order in which a memory cell will typically experience programming. Process 640 is used when the programming operation is being used to increase the memory cell's resistance. Therefore, the first test (step 642) is for a relatively high current, which corresponds to a relatively low resistance. The following steps are for lower and lower currents (higher and higher resistances). Note that the order in which the tests (steps 642, 646, 650, and 654) are performed may be arbitrary. Note that the reference currents in process 640 are not the same reference currents from process 600.

Process 640 refers to four different programming voltage magnitudes V1-V4. Note that these are not the same voltages from process 600. Each programming voltage corresponds to one of the conduction currents (I1-I4) used in process 640. In one embodiment, as the memory cell's resistance is increased to the next level during the RESET operation, the magnitude of the programming voltage may become greater. However, the programming voltages V1-V4 could have any relationship with one another.

Process 640 refers to four different programming voltage pulse widths W1-W4. These also correspond to one of the conduction currents (I1-I4). Note that W1-W4 are not the same widths used in process 600. In one embodiment, as the memory cell's resistance is increased, pulse widths of the programming voltage become wider. However, each successive pulse width could be narrower instead. In one embodiment, each pulse has the same width. The pulse widths could have any relationship with one another.

Process 640 refers to four different current limits (Icomp1-Icomp4). These also correspond to one of the conduction currents (I1-I4). Note that these are not the same current limits used in process 600. In one embodiment, as the memory cell's resistance is increased, the current limit become lower. However, each successive current limit could be larger instead. In one embodiment, each current limit is the same. The current limits could have any relationship to the memory cell's resistance.

In step 642, a determination is made whether the conduction current (Iread) is greater than a first reference current (I1). This first reference current may be a relatively high current in order to test for a relatively low resistance. If Iread is greater than I1, then step 644 is performed to establish one or more programming conditions. In other words, if the memory cell resistance is lower than the relatively low resistance being tested for, then step 644 is performed.

In step 644, the program signal may be set to voltage magnitude V1. In one embodiment, V1 will be the lowest magnitude program voltage that is used in process 600. The pulse width may be set to W1. In one embodiment, W1 will be the shortest width that is used in process 640. The current limit may be set to Icomp1. In one embodiment, the current limit will be the largest current limit that is used in process 640. Process 640 completes if step 644 is performed. Then, step 508 of FIG. 4 may be performed to apply the one or more programming conditions.

If the conduction current (Iread) is not greater than the first reference current (I1), then the conduction current (Iread) is compared to a second reference current (I2). The second reference current (I2) may be less than the first (I1), such that a higher resistance is being tested for. If the conduction current (Iread) is greater than I2, one or more programming conditions are established in step 648. The program signal may be set to voltage magnitude V2. In one embodiment, V2 is greater than V1. The pulse width may be set to W2. In one embodiment, the W2 is wider than W1. The current limit may be set to Icomp2. Icomp2 may be less than Icomp1. The process 640 is then done. Next, step 508 of FIG. 4 may be performed to apply the programming signal.

If the conduction current (Iread) is not greater than the second reference current (I2), then the conduction current (Iread) is compared to a third reference current (I3). If the conduction current (Iread) is less than I3, then one or more programming conditions is established in step 652. The program signal may be set to voltage magnitude V3. In one embodiment, V3 is greater than V2. The pulse width may be set to W3. In one embodiment, the W3 is wider than W2. The current limit may be set to Icomp3. Icomp3 may be less than Icomp2. The process 640 is then done. Next, step 508 of FIG. 4 may be performed to apply the programming signal.

If the conduction current (Iread) is not greater than the third reference current (I3), then the conduction current (Iread) is compared to a fourth reference current (I4). If the conduction current (Iread) is greater than I4, then one or more programming conditions is established in step 656. The program signal may be set to voltage magnitude V4. In one embodiment, V4 is greater than V3. The pulse width may be set to W4. In one embodiment, the W4 is wider than W3. The current limit may be set to Icomp4. Icomp4 may be less than Icomp3. The process 640 is then done. Next, step 508 of FIG. 4 may be performed to apply the programming signal.

If the conduction current (Iread) is not greater than the fourth reference current (I4), then this indicates that no further programming is necessary. A noted, I4 may be a relatively low current in order to test for a relatively high resistance. Thus, if Iread is not greater than I4, then the resistance of the memory cell has been increased to the target level. Therefore, this condition is one embodiment of step 504 of FIG. 4.

Note that the one or more programming conditions might be different for different memory cell materials. In other words, a different pre-determined algorithm could be used for different materials. For example, different programming conditions might be used for metal oxide than for carbon. Table 1 describes programming conditions that might be used for memory cell having a metal oxide switching element. In one embodiment, Table 1 applies to a RESET. The sequence as the resistance increases may be considered to be a pre-determined algorithm.

TABLE 1

| Read current | Resistance | Voltage Magnitude | Pulse Width |
|---|---|---|---|
| Highest | Lowest | Lowest | Shortest |
| 2nd Highest | 2nd Lowest | 2nd Lowest | 2nd Shortest |
| 3rd Highest | 3rd Lowest | 3rd Lowest | 3rd Shortest |
| Lowest | Highest | Highest | Longest |

Table 2 describes programming conditions that might be used for a memory cell having a carbon switching element. In one embodiment, Table 2 applies to a RESET. The sequence as the resistance increases may be considered to be a pre-determined algorithm.

TABLE 2

| Read current | Resistance | Voltage Magnitude | Pulse Width |
|---|---|---|---|
| Highest | Lowest | Highest | Shortest |
| 2nd Highest | 2nd Lowest | 2nd Highest | 2nd Shortest |
| 3rd Highest | 3rd Lowest | 3rd Highest | 3rd Shortest |
| Lowest | Highest | Lowest | Longest |

Figure 8:
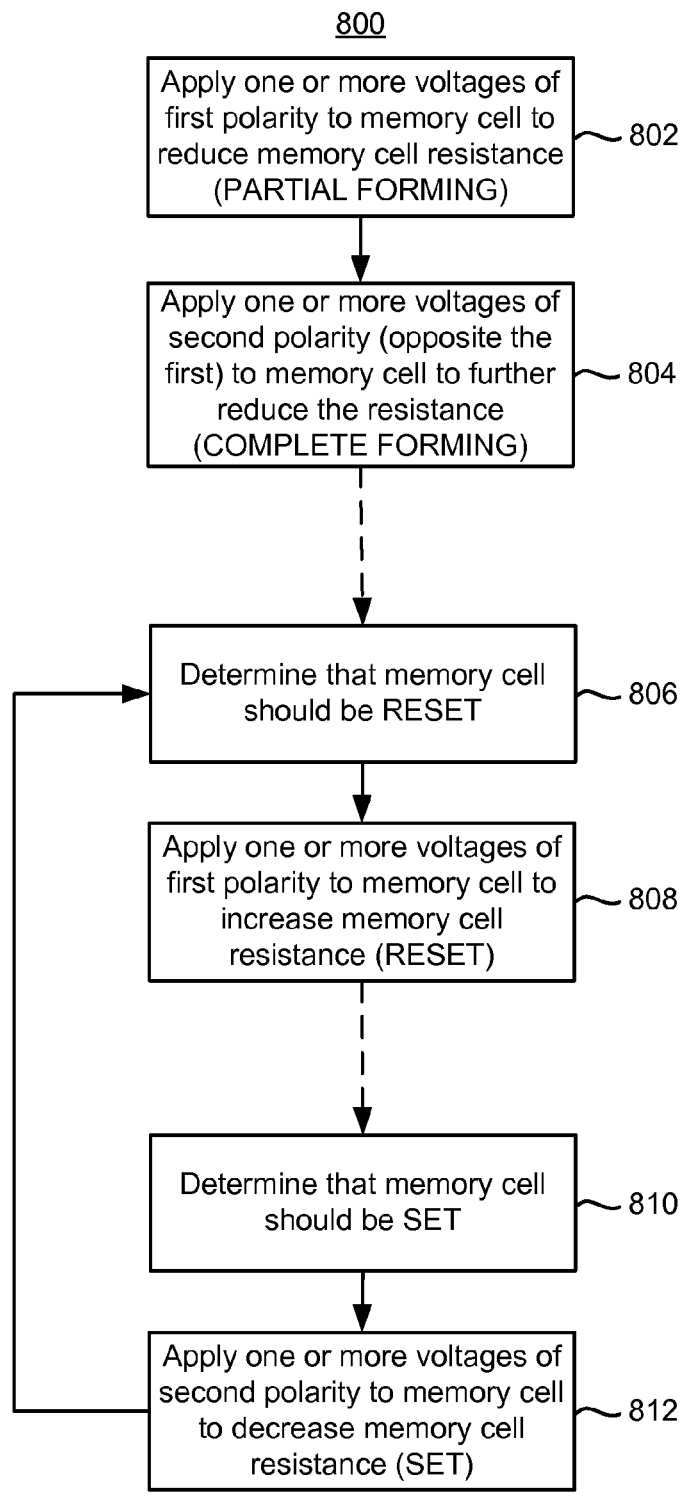
FIG. 8 depicts one embodiment of a process of operation of a memory array of memory cells having reversible resistivity-switching elements.

FIG. 8 depicts one embodiment of a process 800 of operation of a memory array of memory cells 200 having reversible resistivity-switching elements 202. In process 800, bipolar switching is used. By this it is meant that the polarity of the programming voltage for SET is the opposite of RESET. Note that programming techniques described herein are not limited to bipolar switching. In general, process 800 describes an initial forming of memory cells, followed by cycles of RESET and SET. In process 800, forming is a two stage process in which one or more programming voltages of first polarity are used to partially reduce the memory cell resistance. Then, one or more programming voltages of the opposite polarity are used to further reduce the memory cell resistance to complete the forming process. Note that other forming processes could be used. For example, one or more programming voltages of a single polarity could be used to complete the entire forming process.

The memory cells 200 being programmed may have steering elements 204. The steering element 204 could be, but is not limited to, a diode, a p-i-n diode, a punch-thru diode, a Schottky diode, a back-to-back Schottky diode, or an FET. The process 800 may be performed by embedded circuitry in the memory chip, or controlled by an external controller, or manufacturing test hardware, or controlled jointly by embedded circuitry and an external controller.

Process 800 may be initiated when a memory cell 200 is initially to be changed from the high resistance state to the low resistance state. For example, a host device provides memory address and a forming operation command to control logic in a memory device thereby initiating a programming operation for a selected group of cells. In step 802, one or more program voltages are applied to a memory element 202 in order to partially form the memory element 202. The term "partially form" is used because application of one or more voltages having the opposite polarity may be used to complete the formation by further lowering the resistance of the memory element 202 to a target resistance. Applying the first set of one or more voltages may also be referred to as "soft forming." As shown in some of the examples, the memory element 202 may be in series with a diode 204 that is used as a steering element. In some embodiments, the first set of one or more voltages forward biases the diode 204. In some embodiments, the current through the memory element 202 is limited when applying the first voltage.

In step 804, a second set of one or more voltages is applied to the memory element 202 to further reduce the memory cell resistance to the target resistance. Step 804 results in completing the forming of the memory cell. The second set of one or more voltages have the opposite polarity of the first set of one or more voltages. For example, if the first set of one or more voltages forward biased the diode 204, the second set of one or more voltages reverse biases the diode 204. Note that it is not an absolute requirement that the first set of one or more voltages forward biases the diode 204 and the second set of one or more voltages reverse biases the diode 204. In some embodiments, the current through the memory element 202 is limited when applying the second set of one or more voltages.

After step 804, the initial forming the memory cell 200 is complete. Note that because the resistance of the memory cell is low at this time, the memory cell may be considered to be SET at this time. A substantial time may pass before step 806 is performed, as indicated by the dashed arrow. In step 806, a determination is made that the memory cell should be RESET. This determination may be made in response to a request to store new data in the memory cell 200.

In step 808, a set of one or more voltages are applied to the memory element 202 in order to RESET the memory element 202. This set may have the same polarity as the first set of one or more voltages used to partially form the memory element 202 in step 802. In some embodiments, this set of one or more voltages forward biases the diode 204. In some embodiments, the current through the memory element 202 is limited when applying this set of one or more voltages. Note that RESETTING the memory element 202 may result in increasing the resistance of the memory element 202 as compared to the resistance after forming the memory element 202.

After step 808, a substantial time may pass before step 810 is performed, as indicated by the dashed arrow. In step 810, a determination is made that the memory cell should be SET. This determination may be made in response to a request to store new data in the memory cell 200. In step 812, the memory cell is SET by applying a set of one or more voltages to the memory element 202. This set of voltages may have the opposite polarity as those used in the RESET. In some embodiments, this set of one or more voltages reverse biases the diode 204. Note that SETTING the memory element 202 may result in decreasing the resistance of the memory element 202 as compared to the resistance after RESETTING the memory element 202. The process 800 then continues to RESET and SET the memory cell 200 based on determinations that the state of the memory cell 200 should be changed. Note that RESET and SET are accomplished in process 800 with voltages having opposite polarity from each other. Therefore, process 500 uses bipolar switching of memory cells 200.

Figure 9A:
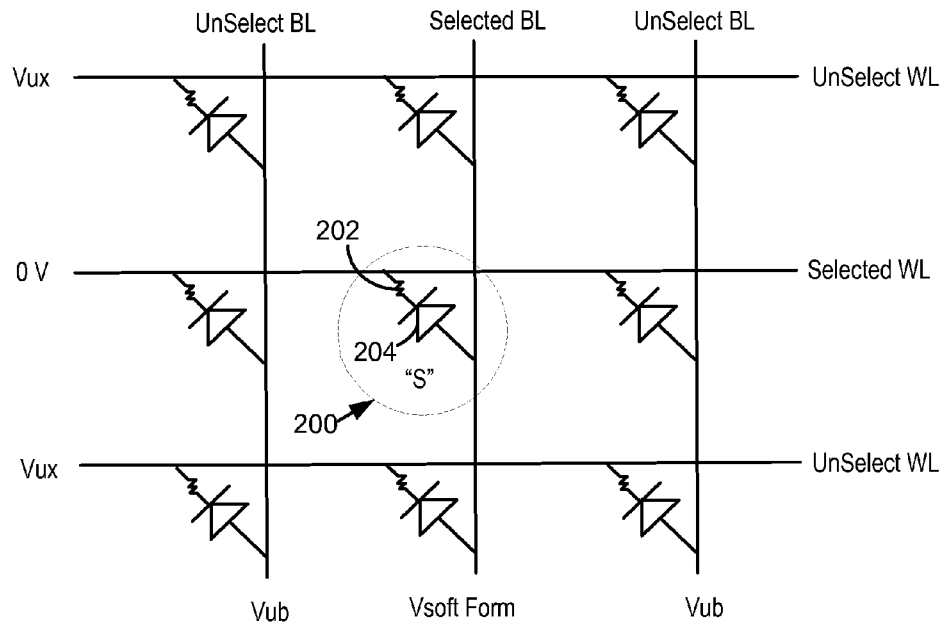
FIG. 9A, FIG. 9B, FIG. 9C, and FIG. 9D depict array biasing schemes.

FIG. 9A depicts one embodiment of an array biasing scheme for partially forming a memory cell 200 that has reversible resistivity switching element 202 and a diode 204 as a steering element. The example array biasing scheme may be used when implementing step 802 from process 800 in FIG. 8. In this example, the diode 204 of the selected memory cell 200 ("S") is forward biased. In this biasing scheme, Vsoft_form is applied to the selected bit line (BL) while the selected word line (WL) is grounded. The voltage Vsoft_form may be determined based on the memory cell resistance (or read current) and possibly on a pre-determined algorithm. For example, process 500 of FIG. 4 may be used. Unselected word lines each have Vux applied thereto. In one embodiment, Vux is about Vsoft_form−0.7V. This results in about 0.7 V across unselected memory cells 200 that are along the selected bit line. Unselected bit lines each have Vub applied thereto. In one embodiment, Vub is about 0.7V. This results in about 0.7V across unselected memory cells 200 that are along the selected word line. The diodes 202 of memory cells 200 along both an unselected word line and an unselected bit line may be reverse biased. In one embodiment, such memory cells 200 have about −(Vsoft_form−1.4 V) across them (from bit line to word line). Note that the voltages are presented as examples and that other voltages could be used.

Figure 9B:
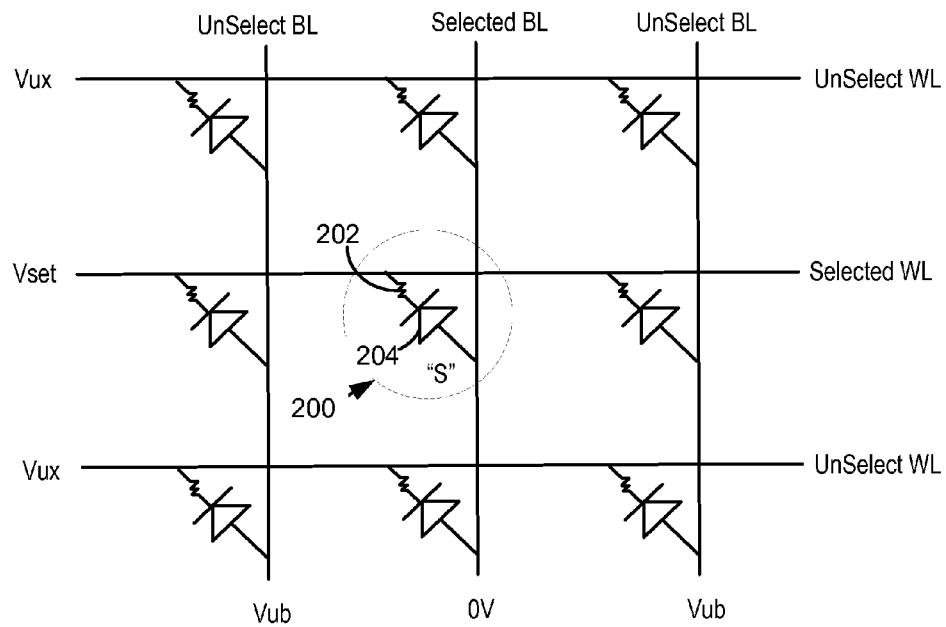

FIG. 9B depicts one embodiment of an array biasing scheme for either completing the forming process or for SETTING a memory cell 200 that has reversible resistivity switching element 202 and a diode 204 as a steering element. The example array biasing scheme may be used to implement step 804 from process 800 in FIG. 8. The example array biasing scheme may also be used to implement step 812 from process 800 in FIG. 8. In this example, the diode 204 of the selected memory cell 200 is reverse biased. In this biasing scheme, Vset is applied to the selected word line (WL) while the selected bit line (BL) is grounded. Characteristics of Vset such as the magnitude and pulse width may be determined based on the memory cell resistance (or read current). For example, process 500 of FIG. 4 may be used. Unselected word lines each have Vux applied thereto. In one embodiment, Vux is about Vset/2. Unselected bit lines each have Vub applied thereto. In one embodiment, Vub is about Vset/2.

Figure 9C:
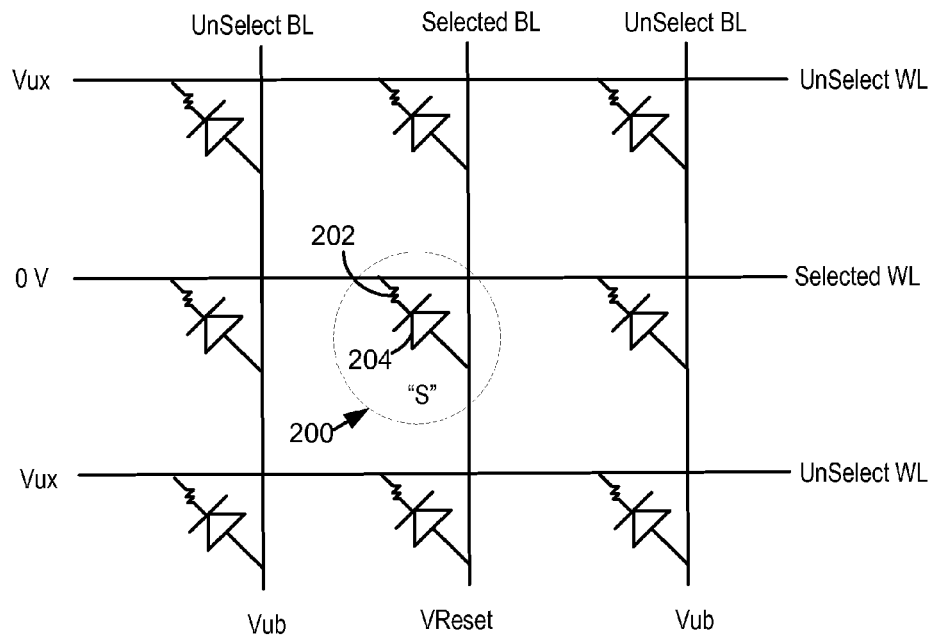

FIG. 9C depicts one embodiment of an array biasing scheme for RESETTING a memory cell 200 that has reversible resistivity switching element 202 and a diode 204 as a steering element. The example array biasing scheme may be used to implement step 806 from process 800 in FIG. 8. In this example, the diode 204 of the selected memory cell 200 ("S") is forward biased. In this biasing scheme, Vreset is applied to the selected bit line (BL) while the selected word line (WL) is grounded. Characteristics of Vreset such as the magnitude and pulse width may be determined based on the memory cell resistance (or read current). For example, process 500 of FIG. 4 may be used. Unselected word lines each have Vux applied thereto. In one embodiment, Vux is about Vreset−0.7V. This results in about 0.7V across unselected memory cells 200 that are along the selected bit line. Unselected bit lines each have Vub applied thereto. In one embodiment, Vub is about 0.7V. This results in about 0.7V across unselected memory cells 200 that are along the selected word line. The diodes 202 of memory cells 200 along both an unselected word line and an unselected bit line may be reverse biased. In one embodiment, such memory cells 200 have about −(Vreset−1.4 V) across them (from bit line to word line).

Figure 9D:
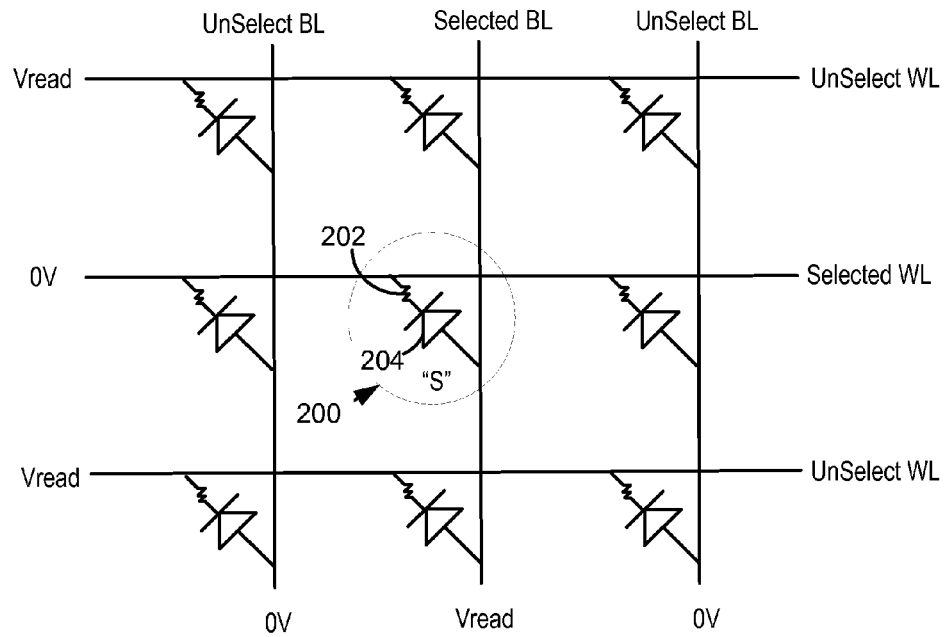

FIG. 9D depicts one embodiment of an array biasing scheme for reading a memory cell 200 that has reversible resistivity switching element 202 and a diode 204 as a steering element. In this example, the diode 204 of the selected memory cell 200 ("S") is forward biased when reading; however, forward biasing is not an absolute requirement. In this biasing scheme, Vread is applied to the selected bit line (BL) while the selected word line (WL) is grounded. As an example Vread may be about 2.0V. However, Vread could be higher or lower. In some embodiments, a different Vread is used for different parts of the programming process. For example, Characteristics of Vread such as the magnitude and pulse width may be determined based on the memory cell resistance (or previous read current). Unselected word lines each have Vread applied thereto in this example. This results in about 0V across unselected memory cells 200 that are along the selected bit line. Unselected bit lines are grounded in this example. This results in about 0V across unselected memory cells 200 that are along the selected word line. The diodes 202 of memory cells 200 along both an unselected word line and an unselected bit line may be reverse biased. In one embodiment, such memory cells 200 have about −(Vread) across them (from bit line to word line).

Figure 10A:
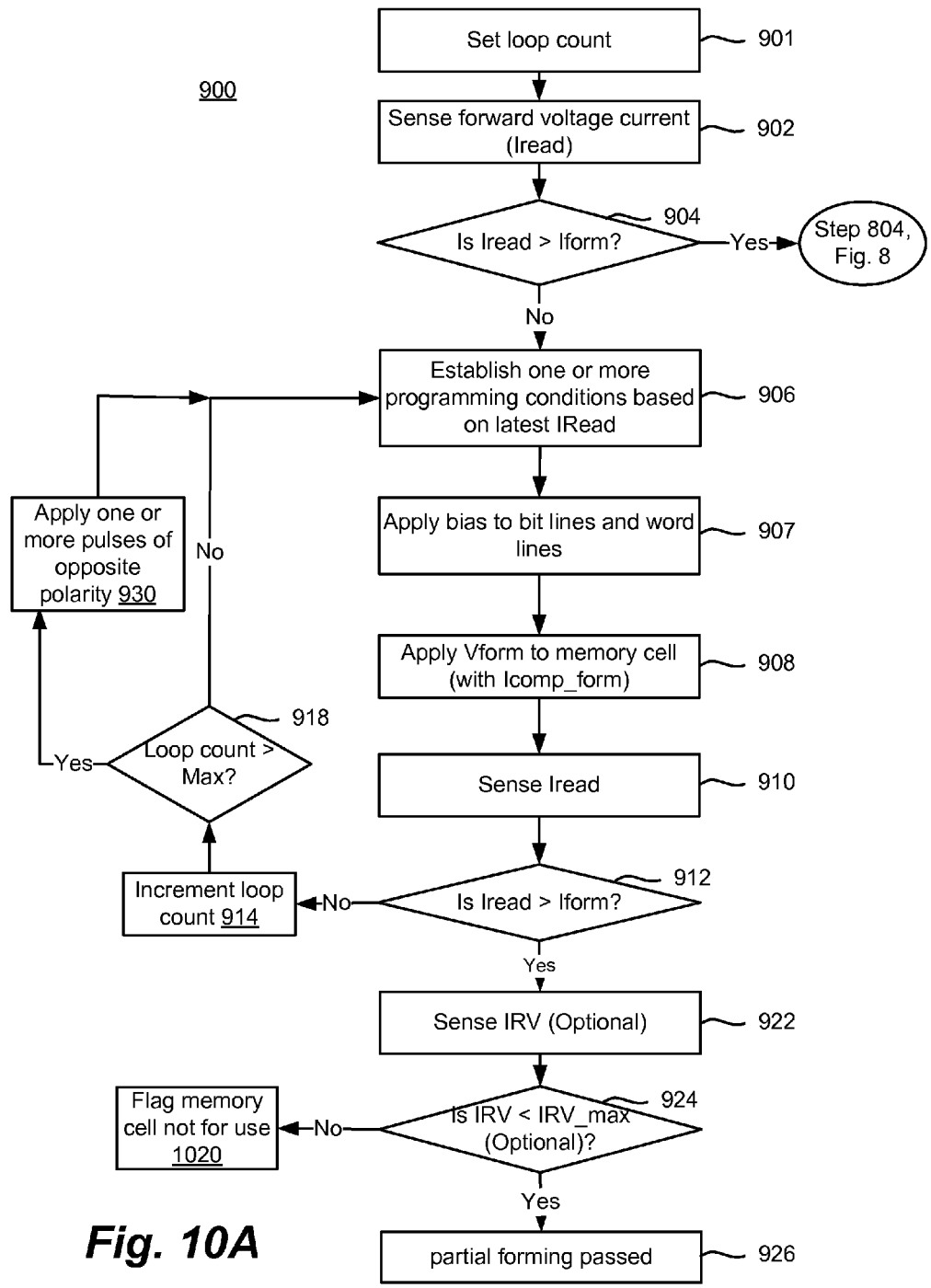
FIG. 10A describes one embodiment of a process that may be used for partial forming.
Figure 10B:
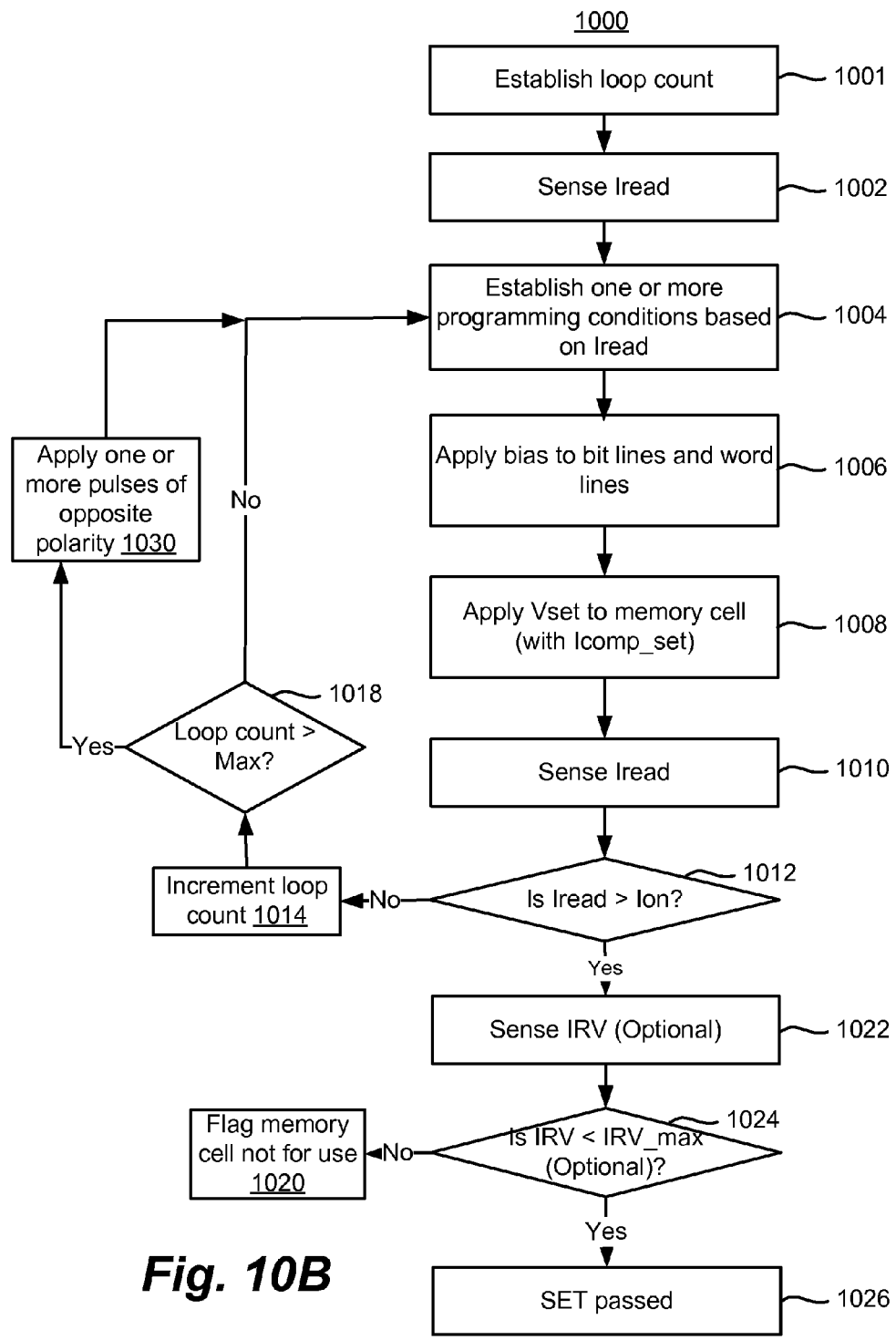
FIG. 10B describes one embodiment of a process that may be used for completion of forming or SET.
Figure 10C:
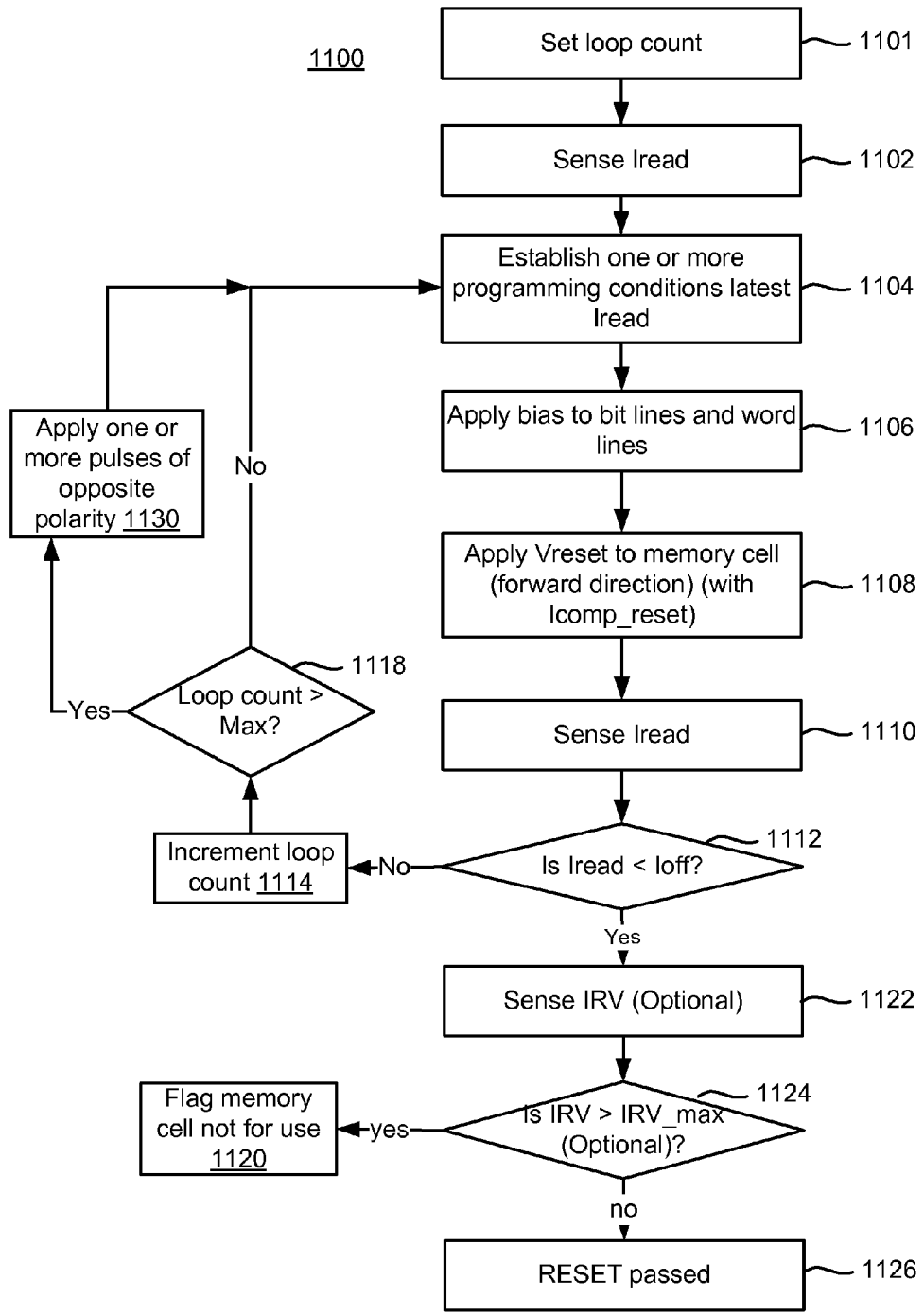
FIG. 10C describes one embodiment of a process that may be used for RESET.

Next, further details of performing programming operations for process 800 will be discussed. FIG. 10A describes one embodiment of a process that may be used for partial forming (step 802). FIG. 10B describes one embodiment of a process that may be used for completion of forming or SET (steps 802, 812). FIG. 10C describes one embodiment of a process that may be used for RESET (step 808). In FIGS. 10A-10C, one or more programming conditions are based on the resistance of the memory cell. The one or more programming conditions may be determined by applying a pre-determined algorithm that may be a function of the memory cell resistance. The pre-determined algorithm may be a function of properties of the memory cell.

FIG. 10A is a flowchart illustrating one embodiment of a process 900 of a first portion of FORMING a memory element 202. Process 900 is one implementation of step 802 of process 800 of FIG. 8. In step 901a loop count is initialized to zero. The loop count is used to limit the number of times that partial forming is attempted. The maximum number of attempts may be established at any value including a single attempt.

In step 902, the memory cell 200 is read with a forward voltage to determine a forward voltage current (Iread) of the memory element 200. In embodiments in which the steering element is a diode, the diode 204 is forward biased. The example biasing scheme for reading memory cells of FIG. 9D may be used. For example, Vread is applied to the selected bit line while the selected word line is grounded. Vread may also be applied to unselected wordlines while unselected bit lines are grounded. An example of Vread is 2.0V. The circuit of FIG. 3 may be used to sense the forward bias current (Iread).

In step 904, the forward voltage current (Iread) is compared to a "soft form current." The soft form current is a value that indicates whether the resistance of the memory cell 200 is at a target resistance for a partially formed memory cell 200. The soft form current is typically a value that is less than the "on current," which may be referred to as "Ion." As previously discussed, SETTING the memory element 202 lowers its resistance, and hence increases the current for a given read voltage. The current Ion may be defined as a current that indicates that the resistance of the memory cell 200 is at a target value for being SET. Note that in some embodiments, the target resistance for SET is the same as the target resistance for a memory cell 200 that is completely formed, but that is not a requirement. Because the target resistance after partially forming the memory cell is higher than the target resistance for SET, Iform is typically lower than Ion.

If the forward current (Iread) is already greater than Iform, then it is not necessary to perform partial forming and the process goes to step 804 of FIG. 8. In other words, the resistance of the memory cell 200 is already at the target resistance for partial forming; therefore, it is not necessary to apply the voltage to partially form the memory cell. However, if the forward current (Iread) is less than Iform, then the process continues at step 906.

In step 906, one or more programming conditions are determined based on the memory cell resistance. The one or more programming conditions determination may also be based on a pre-determined algorithm, which may be a function of memory cell resistance. For example, one or more of a program voltage magnitude, a program voltage pulse width, and/or a current limit is determined based on the memory cell resistance. A process such as that is FIG. 6B may be used to determine the one or more programming conditions. For purposes of discussion, the soft form voltage "Vform" and current limit "Icomp_form" are determined in step 906. Determining Vform may include determining any characteristics including, but not limited to, voltage magnitude, pulse width, and transition rate.

In step 907, bias voltages are applied to bit lines and word lines. For example, Vux may be applied to word lines and Vub may be applied to bit lines.

In step 908, a "soft forming voltage" is applied to the memory element 202. For example, Vsoft_form may be applied to the selected bit line while the selected word line is grounded. An example range of the soft forming voltage is between about 4.5V to 7V. However, the soft forming voltage may be higher or lower. During soft forming, the current that is supplied to the memory element 202 may be limited to a current Icomp_form. In one embodiment, the biasing scheme depicted in FIG. 8A is used for steps 907-908.

In step 910, the forward current (Iread) is sensed again. In step 912, the forward current (Iread) is compared to the soft form current, Iform. If the forward current (Iread) is larger than the soft form current, Iform, then the soft forming was successful and the process continues at step 922. In other words, the resistance of the memory cell 200 has been reduced to at or below a target resistance for partial forming.

If it is determined in step 912 that the forward current (Iread) is smaller than the soft form current, Iform, then another attempt at soft forming may be attempted. At step 914, the loop count is incremented. If the loop count has not reached the maximum value (step 918), then the process returns to step 906 to determine one or more programming conditions for the next iteration.

If the loop count has reached the maximum at step 918, then one or more pulse of the opposite polarity may be applied to the memory cell, in step 930. For example, instead of using the polarity as indicated in FIG. 9A, a biasing scheme similar to FIG. 9B might be used. Any suitable voltage magnitude and pulse duration may be used. Any suitable current limit may be used. In one embodiment, one or more programming conditions are determined based on the memory cell's resistance. However, it is not required that programming conditions be based on the memory cell's resistance. After step 930, the process goes back to step 906 to determine one or more programming conditions for the next iteration. Note that the polarity of the programming signal is now returned to normal. For example, the biasing scheme of FIG. 9A may again be used.

Assuming that step 912 determines that the forward current (Iread) is greater than Iform, the process continues at step 922. In step 922, the reverse current (IRV) is sensed. In step 922, the memory cell 200 is read with a reverse voltage to determine a reverse current (IRV) of the memory element 200. In embodiments in which the steering element is a diode, the diode 204 is reverse biased. For example, Vread is applied to the selected word line while the selected bit line is grounded. In one embodiment, Vread is applied to unselected word lines while the unselected bit lines are grounded. The circuit of FIG. 3 may be used to sense the reverse current (IRV).

In step 924, the reverse current (IRV) is compared to a maximum allowed reverse current, IRV_max. If the reverse current (IRV) is less than the maximum allowed reverse current IRV_max, then the partial forming is recorded as successful at step 926. The process 900 then ends. Note that steps 922 and 924 are optional. In some embodiments diode damage is limited or absent and is detected by other test steps or not at all.

On the other hand, if the reverse current (IRV) is larger than the maximum allowed reverse current, IRV_max, this may indicate that the diode 204 is damaged. The process goes to step 920 where the memory cell 200 is flagged such that it is not used. The process 900 then ends.

FIG. 10B is a flowchart illustrating one embodiment of a process 1000 of a program operation that reduces the resistance of a memory element 202. For example, process 1000 may be used to SET a memory cell. It may also be used during a FORMING process. Process 1000 is one implementation of step 804 of process 800 of FIG. 8. Thus process 1000 may be performed after successful completion of soft or partial forming as depicted in FIG. 8. Note that process 1000 may also be used to SET a memory cell 200. Thus, process 1000 may also be used to implement step 812 of process 800. Note that completing the forming of the memory cell may be thought of as SETTING the memory cell. Therefore, process 1000 will be discussed by referring to SETTING the memory cell. It will be understood that this may refer to either step 804 or 812 of process 500.

In step 1001, a loop count is initialized to zero. The loop count is used to limit the number of times that SET is attempted. The maximum number of SET attempts may be established at any value including a single attempt.

In step 1002, the current of the memory cell is sensed. The example biases of FIG. 9D may be used. As noted herein, the current may be an indication of the memory cell resistance.

In step 1004, one or more programming conditions are determined based on the memory cell current. This determination may also be based on a pre-determined algorithm, which may be a function of memory cell resistance. The process of FIG. 6B may be used to determine the one or more programming conditions based on the current detected in step 1002. Note that a different algorithm (and different current references) may be used as compared to the process of FIG. 10A, which described the initial partial forming of the memory cell. A set voltage "Vset" and a current limit "Icomp_set" may be determined in step 1104.

In step 1006, bias voltages are applied to bit lines and word lines. For example, Vux may be applied to word lines and Vub may be applied to bit lines. In one embodiment, step 1006 includes raising the voltage to the word lines from ground to Vux and raising the voltage to the bit lines from ground to Vub. Note that the selected word line and the selected bit line may be treated the same as the unelected word lines and bit lines in step 1006. In embodiments in which the steering element is a p-i-n diode, Vux may be about 5V and Vub may be about 5V. In embodiments in which the steering element is a punch-thru diode, Vux may be about 3V and Vub may be about 5V. Other voltages may be used.

In step 1008, a "SET" of the memory element 202 is attempted. The SET voltage that is applied to the memory element 202 may have been determined in step 1004. In one embodiment, the biasing scheme depicted in FIG. 9B is used during step 1008. For example, Vset may be applied to the selected word line while the selected bit line is grounded. During SET, the current that is supplied to the memory element 202 may be limited to a current Icomp, which may have been determined in step 1004. Note that in this embodiment, the SET may be a reverse SET (e.g., diode is reverse biased). However, in other embodiments, the diode is forward biased during SET.

In step 1010, the forward current (Iread) is sensed. In one embodiment, sensing Iread includes biasing the array as depicted in FIG. 9D. However, other biasing schemes could be used.

In step 1012, the forward current (Iread) is compared to an on current, Ion. As previously discussed, SETTING the memory cell 200 lowers the resistance, and hence increases the current for a given read voltage. The on current (Ion) may be defined as a current that indicates that the resistance of the memory cell 200 is at a sufficiently low value. If the forward current (Iread) is larger than the Ion, then the resistance of the memory element 202 is sufficiently low and the process continues at step 1022. In one implementation, the circuit of FIG. 3 is used to compare Iread with Ion.

If the forward current (Iread) is smaller than Ion, then additional attempts may be made to SET the memory cell. In step 1014, the loop count is incremented. If the loop count is not at the maximum allowed number of attempts (step 1018), then the process returns to step 1004 to determine one or more programming conditions. These conditions may be based on the Iread that was determined in step 1010.

However, if the maximum number of attempts to SET has been reached, then one or more pulse of the opposite polarity may be applied to the memory cell, in step 1030. For example, instead of using the polarity as indicated in FIG. 9B, a biasing scheme similar to FIG. 9A or 9C might be used. Any suitable voltage magnitude and pulse duration may be used. Any suitable current limit may be used. In one embodiment, one or more programming conditions are determined based on the memory cell's resistance. However, it is not required that programming conditions be based on the memory cell's resistance. After step 1030, the process goes back to step 1004 to determine one or more programming conditions for the next iteration. Note that the polarity of the programming signal is now returned to normal. For example, the biasing scheme of FIG. 9B may again be used.

Assuming that step 1012 determines that Iread is greater than Ion, the process continues at step 1022. In step 1022, the reverse current (IRV) may be sensed. In step 1024, the reverse current (IRV) may be compared to a maximum allowed reverse current, IRV_max. If the reverse current (IRV) is less than the maximum allowed reverse current IRV_max, then the SET is recorded as successfully at step 1026. The process then ends. Note that steps 1022 and 1024 are optional.

On the other hand, if the reverse current (IRV) is larger than the maximum allowed reverse current, IRV_max, this may indicate that the diode 204 is damaged. The process goes to step 1020 where the memory cell 200 is flagged such that it is not used. The process then ends.

FIG. 10C is a flowchart illustrating one embodiment of a process 1100 of RESETTING a memory element 202. Process 1100 is one implementation of step 808 of process 800 of FIG. 8. Thus, process 1100 may be performed after a determination is made that a memory cell 200 should be RESET. In step 1101, a loop count is initialized to zero. The loop count is used to limit the number of times that RESET is attempted. The maximum number of attempts may be established at any value including a single attempt.

In step 1102, a conduction current of the memory cell is sensed. The example biases of FIG. 9D may be used. As noted herein, the current may be an indication of the memory cell resistance.

In step 1104, one or more programming conditions are determined based on the conduction current. This determination may also be based on a pre-determined algorithm, which may be a function of memory cell resistance. The process of FIG. 7B may be used to determine the one or more programming conditions. Note that a different algorithm (and different current references) may be used as compared to the processes of FIGS. 10A and 10B. A reset voltage "Vreset" and a current limit "Icomp reset" may be determined in step 1104.

In step 1106, bias voltages are applied to unselected bit lines and unselected word lines. For example, Vux may be applied to word lines and Vub may be applied to bit lines.

In step 1108, a "RESET" voltage is applied to the memory element 202. In one embodiment, a RESET voltage is applied to the selected bit line. In one embodiment, the biasing scheme depicted in FIG. 9C is used during the RESET step 1108. For example, Vreset may be applied to the selected bit line while the selected word line is grounded. Note that the RESET voltage may be the opposite polarity as the SET voltage. During RESET, the current that is supplied to the memory element 202 may be limited to a current Icomp reset.

In step 1110, the forward current (Iread) is sensed. In step 1112, the forward current (Iread) is compared to an off current (Ioff). As previously discussed, RESETTING the memory cell 200 increases the resistance, and hence decreases the current for a given read voltage. The off current (Ioff) may be defined as a current that indicates that the resistance of the memory cell 200 is at a sufficiently high value to be considered to be RESET. If the forward current (Iread) is less than the off current (Ioff), then resistance of the memory element 202 is sufficiently high and the process continues at step 1122.

If the forward current (Iread) is larger than Ioff, then additional attempts may be made to RESET the memory cell 200. In step 1114, the loop count is incremented. If the loop count is not at the maximum allowed number of attempts (step 1118), then the process returns to step 1104 to determine one or more programming conditions based on memory cell current (or resistance). The current that was sensed in step 1110 may be used. As noted above, process 6B may be used during step 1104.

However, if the maximum number of attempts to RESET has been reached, then one or more pulse of the opposite polarity may be applied to the memory cell, in step 1130. For example, instead of using the polarity as indicated in FIG. 9C, a biasing scheme similar to FIG. 9B might be used. Any suitable voltage magnitude and pulse duration may be used. Any suitable current limit may be used. In one embodiment, one or more programming conditions are determined based on the memory cell's resistance. However, it is not required that programming conditions be based on the memory cell's resistance. After step 1130, the process goes back to step 1104 to determine one or more programming conditions for the next iteration. Note that the polarity of the programming signal is now returned to normal. For example, the biasing scheme of FIG. 9C may again be used.

Assuming that it is determined in step 1112 that the forward current (Iread) is less than Ioff, the process continues at step 1122. In step 1122, the reverse current (IRV) is sensed. In step 1124, the reverse current (IRV) is compared to a maximum allowed reverse current, IRV_max. If the reverse current IRV is less than the maximum allowed reverse current IRV_max, then the soft forming is recorded as successfully at step 1126. The process then ends. Note that steps 1122 and 1124 are optional. In some embodiments diode damage is limited or absent and is detected by other test steps or not at all.

On the other hand, if the reverse current (IRV) is larger than the maximum allowed reverse current, IRV_max, this may indicate that the diode 204 is damaged. The process goes to step 1120 where the memory cell 200 is flagged such that it is not used. The process then ends.

Figure 11:
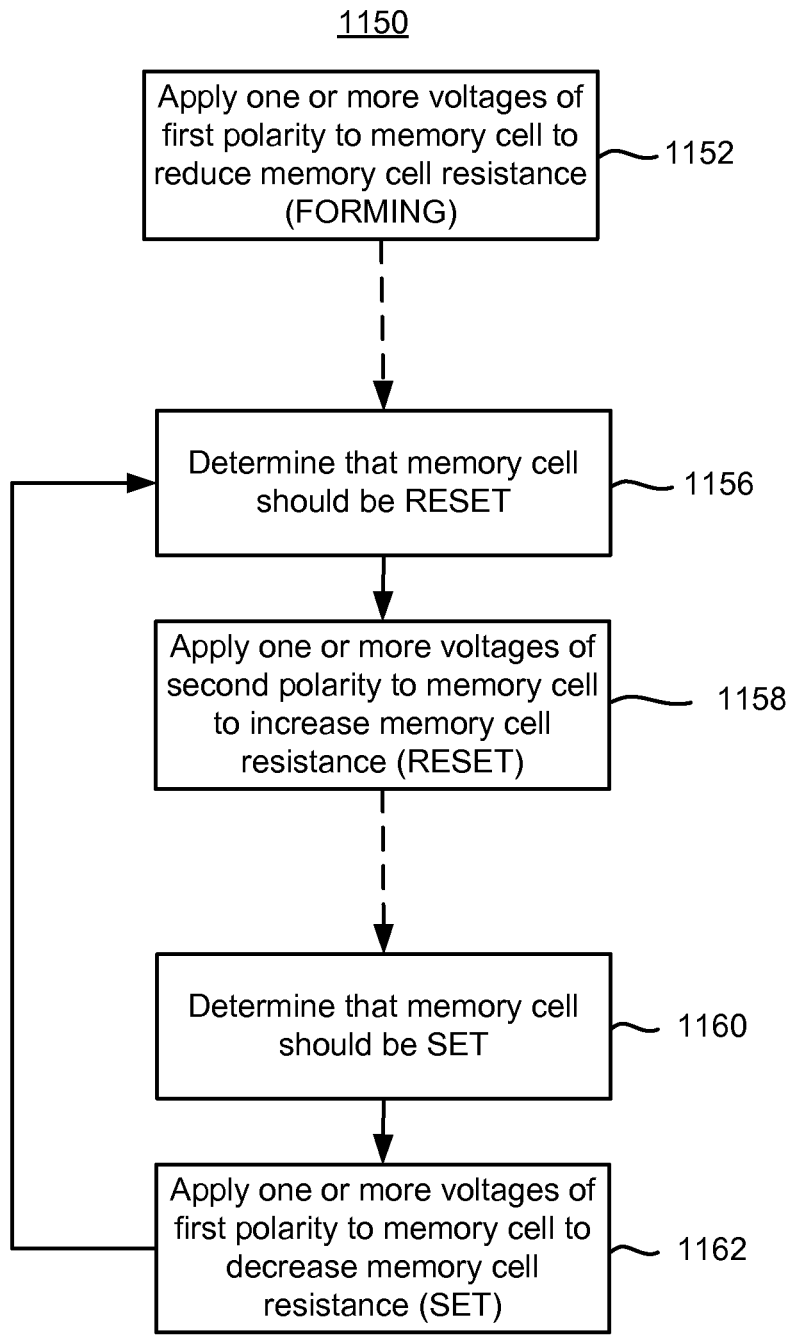
FIG. 11 is flowcharts of one embodiment of a process of operation a memory array in which forming uses a single polarity and bipolar switching is used.

Note the programming techniques described herein are not limited to the example operations described in FIG. 8. In another embodiment, forming the memory cell uses programming signals having a single polarity. In this case, programming signals used in the SET operation may have the same polarity as for forming. The programming signals used in the RESET operation may have the opposite polarity as for SET and forming. FIG. 11 is a flowchart of one embodiment of a process 1150 of operation a memory array in which forming uses a single polarity and bipolar switching is used.

In step 1152 one or more voltages of a first polarity are applied to the memory cell to attempt to reduce the resistance of the memory cell. This first voltage may forward bias a steering element in the memory cell, but this is not a requirement. Since this is the initial time the memory cell is being programming, this operation may be referred to as forming. One or more programming conditions may be determined based on the memory cell's resistance and a pre-defined algorithm. For example, a process such as process 500 or 600 may be used.

In step 1156, a determination is made that the memory cell should be RESET. In step 1158, one or more voltages of a second polarity (opposite the first) are applied to the memory cell to attempt to increase the resistance of the memory cell (RESET). This second voltage may reverse bias a steering element in the memory cell, but this is not a requirement. One or more programming conditions may be determined based on the memory cell's resistance and a pre-defined algorithm. For example, a process such as process 500 or 640 may be used.

In step 1160, a determination is made that the memory cell should be SET. In step 1162, one or more voltages of the first polarity are applied to the memory cell to attempt to increase the resistance of the memory cell (SET). This first voltage may forward bias a steering element in the memory cell, but this is not a requirement. One or more programming conditions may be determined based on the memory cell's resistance and a pre-defined algorithm. For example, a process such as process 500 or 600 may be used.

Note that for the process of FIG. 8 and FIG. 11, it was described that one or more programming conditions for forming, SET, and RESET were determined based on memory cell resistance. However, it will be noted that it is not required that this be done for all of the programming operations. For example, for some devices, it may be that RESET programming conditions are not determined based on the memory cell's resistance (as one example).

Note that although some embodiments have described a process in which forming the memory cell is used prior to cycles of SET and RESET, forming the memory cell is not a requirement in all cases. For example, there may be some memory cells for which an initial forming process is not performed.

Figure 13:
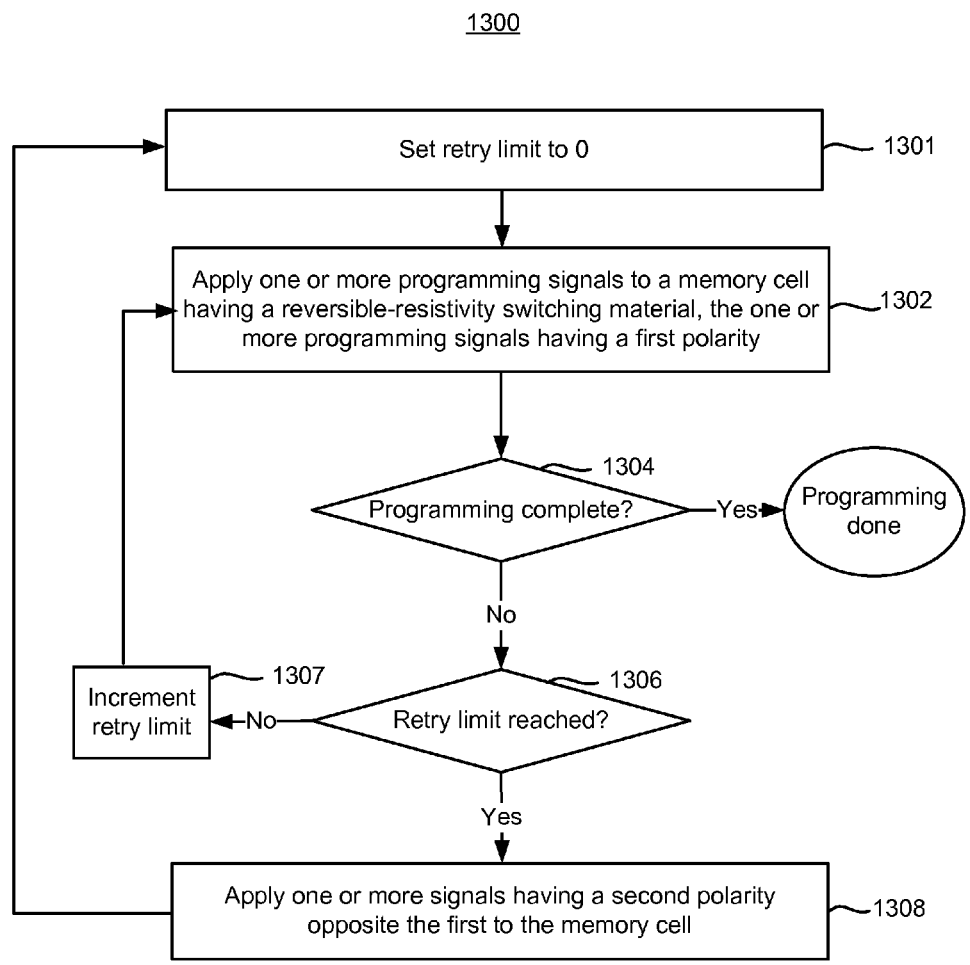
FIG. 13 is a flowchart of one embodiment of a process of programming non-volatile storage.

FIG. 13 is a flowchart of one embodiment of a process 1300 of programming non-volatile storage. The process 1300 may be used with memory cells have reversible-resistivity switching materials. In process 1300, if a programming operation retry limit has been reached, then one or more signals having an opposite polarity of those used in a programming operation are applied. Then, the programming operation may be retried. The programming operation may be FORMING, SET, or RESET, as examples. In step 1301, a retry limit is set to zero.

In step 1302, one or more programming signals having a first polarity are applied to a memory cell having a reversible-resistivity switching material. One or more programming conditions may be determined based on the memory cell's resistance, but this is not required. In one embodiment, a voltage pulse having the first polarity is applied to the memory cell. This first polarity may forward bias or reverse bias a steering element.

In step 1304, a determination is made whether the programming operation is complete in response to applying the one or more programming signals. For example, the memory cell is read to determine its current, which is compared to a reference current. The process 1300 ends if programming is complete.

In step 1306, a determination is made whether a retry limit of programming attempts has been reached. The retry limit may be any amount. If the retry limit has not been reached, it is incremented in step 1307. Then, one or more additional programming signals having the first polarity are applied to the memory cell in step 1302.

If the programming operation is not complete (step 1304=no) and if the retry limit has not been reached (step 1306=yes), the one or more signals having a second polarity that is opposite the first polarity are applied to the memory cell in step 1308. One or more programming conditions may be determined based on the memory cell's resistance, but this is not required. In one embodiment, a voltage pulse having the second polarity is applied to the memory cell. This second polarity may forward bias or reverse bias a steering element.

After applying the one or more signals having the second polarity, step 1301 may be performed to reset the retry limit to zero. Then, the programming operation is retried by applying one or more additional programming signals having the first polarity to the memory cell in step 1302. The process 1300 continues on after step 1302. Note that a different retry limit could be used this time. The process 1300 could have an additional global retry limit to stop the programming process if step 1308 is performed too many times.

Embodiments disclosed herein achieve a lower reverse bias operation voltage reduction, tighter forming current level distributions, and a more stable memory cell. Reduction in the operation voltage, and a tight distribution reduces the voltage and current requirements on the support circuitry (e.g., CMOS devices) which leads to density increases, power savings and can simplify the process of the high voltage CMOS. For use as a steering element a shorter and higher endurance PIN diode results from the voltage and current reduction. Other types of steering element are also easier to develop and manufacture at lower voltages and currents. The well controlled characteristics achieved with the step initialization method may achieve a lower cost RRAM with metal oxide, carbon or other types of resistive materials.

One embodiment includes a method of operating non-volatile storage including the following. Information indicative of resistance of a memory cell having a reversible resistivity-switching memory element is determined. A determination is made whether a programming operation is complete based on the information. One or more programming conditions to apply to the memory cell are determined based on the information and a pre-determined algorithm that is based on properties of the memory cell having the reversible resistivity-switching memory element. The determining one or more programming conditions is performed if the programming operation is not yet complete. The one or more programming conditions are applied to the memory cell if the programming operation is not yet complete. Determining the information indicative of resistance, determining whether the operation is complete, determining one or more programming conditions, and applying the one or more programming conditions are repeated until it is determined that the programming operation is complete.

One embodiment includes a storage system, comprising a plurality of non-volatile memory cells and one or more management circuits in communication with the plurality of non-volatile memory cells. Individual memory cells have a reversible resistivity-switching memory element. The one or more management circuits determine information indicative of resistance of a first of the memory cells as a part of a programming operation one or more management circuits determine whether the programming operation is complete for the memory cell based on the information. The one or more management circuits determine a programming signal to apply to the memory cell based on the information indicative of resistance and a pre-determined algorithm that is based on properties of the memory cell having the reversible resistivity-switching memory element. The determining a programming signal is performed if the programming operation is not yet complete. The one or more management circuits apply the programming signal to the memory cell if the programming operation is not yet complete. The one or more management circuits continue to determine the information indicative of resistance, determine whether the programming operation is complete, determine a programming signal, and apply the programming signal until it is determined that the programming operation is complete for the memory cell.

One embodiment includes a method of operating non-volatile storage that includes the following. Information indicative of resistances of individual ones of the memory cells is determined as a part of a programming operation. A determination is made whether the programming operation is complete for each memory cell based on the information for each memory cell. A programming pulse to apply to individual ones of the memory cells is determined if the programming operation is not yet complete for the memory cell. One or more characteristics of the programming pulse are based on the information indicative of resistance of the memory cell. The determining a programming pulse includes applying a pre-determined algorithm that is based on properties of the memory cell having the reversible resistivity-switching memory element. The pre-determined algorithm is a function of resistance of the memory cell. The programming pulse is applied to appropriate ones of the memory cells. The determining the information indicative of resistances, determining whether the programming operation is complete, determining a programming pulse, and applying the programming pulse is repeated until it is determined that the programming operation is complete for the memory cells.

One embodiment includes a storage system, comprising a plurality of non-volatile memory cells and one or more management circuits in communication with the plurality of non-volatile memory cells. Individual memory cells including a reversible resistivity-switching memory element. The one or more management circuits determine information indicative of resistances of individual ones of the memory cells as a part of a programming operation. The one or more management circuits determine whether the programming operation is complete for each memory cell based on the information indicative of resistance for each memory cell. The one or more management circuits determine a programming pulse to apply to individual ones of the memory cells if the programming operation is not yet complete for the memory cell. One or more characteristics of the programming pulse are based on the resistance of the memory cell and a pre-determined algorithm that is based on properties of a memory cell having the reversible resistivity-switching memory element. The one or more management circuits apply the programming pulse to appropriate ones of the memory cells. The one or more management circuits continue to determine the information indicative of resistances, determine whether the programming operation is complete, determine a programming pulse, and apply the programming pulse until it is determined that the programming operation is complete for the memory cells.

One embodiment includes a method of operating non-volatile storage that includes the following. One or more programming signals having a first polarity are applied to a memory cell having a reversible-resistivity switching material. A determination is made whether a programming operation is complete in response to applying the one or more programming signals. One or more additional programming signals having the first polarity are applied to the memory cell if the programming operation is not complete and if a retry limit has not been reached. One or more additional programming signals having a second polarity that is opposite the first polarity are applied to the memory cell if the retry limit has been reached. The programming operation is retried by applying one or more additional programming signals having the first polarity to the memory cell after applying the one or more additional programming signals having the second polarity.

One embodiment includes a storage system, comprising a plurality of non-volatile memory cells and one or more management circuits in communication with the plurality of non-volatile memory cells. Individual memory cells have a reversible resistivity-switching memory element. The one or more management circuits apply one or more programming signals having a first polarity to a first of the memory cells. The one or more management circuits determine whether a programming operation is complete in response to applying the one or more programming signals. The one or more management circuits apply one or more additional programming signals signal having the first polarity to the first memory cell if the programming operation is not complete and if a retry limit has not been reached. The one or more management circuits apply one or more additional programming signals having a second polarity that is opposite the first polarity to the first memory cell if the retry limit has been reached. The one or more management circuits retry the programming operation by applying one or more additional programming signals having the first polarity to the first memory cell after applying the one or more additional programming signals having the second polarity.

The foregoing detailed description has been presented for purposes of illustration and description. It is not intended to be exhaustive or be limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A method of operating non-volatile storage, the method comprising:

determining information indicative of resistance of a memory cell having a reversible resistivity-switching memory element;

determining whether a programming operation is complete based on the information;

determining one or more programming conditions to apply to the memory cell based on the information and a pre-determined algorithm that is based on properties of the memory cell having the reversible resistivity-switching memory element, including determining a first programming signal when the information indicative of resistance is between a first value and a second value and determining a second programming signal when the information indicative of resistance is between the second value and a third value, determining one or more programming conditions is performed if the programming operation is not yet complete;

applying the one or more programming conditions to the memory cell if the programming operation is not yet complete; and repeating the determining the information indicative of resistance, the determining whether the operation is complete, the determining one or more programming conditions, and the applying the one or more programming conditions until it is determined that the programming operation is complete.

2. The method of claim 1, wherein the second programming signal has a different voltage magnitude than a voltage magnitude of the first programming signal.

3. The method of claim 1, wherein the second programming signal has a different pulse width than a pulse width of the first programming signal.

4. The method of claim 1, wherein the determining a programming signal includes determining one or more characteristics of a voltage pulse based on the information indicative of resistance.

5. The method of claim 1, wherein the programming operation includes SET, RESET, and forming.

6. The method of claim 1, wherein the reversible resistivity-switching memory element includes a metal oxide.

7. The method of claim 1, wherein the reversible resistivity-switching memory element includes carbon.

8. The method of claim 1, wherein the pre-determined algorithm is based on the type of material used for the reversible resistivity-switching memory element, wherein a first pre-determined algorithm is used when the reversible resistivity-switching memory element comprises a metal oxide and a second pre-determined algorithm is used when the reversible resistivity-switching memory element comprises carbon.

9. The method of claim 1, wherein the memory cell includes a steering element.

10. The method of claim 1, wherein the determining one or more programming conditions to apply to the memory cell based on the information indicative of resistance includes:

determining a current limit for the memory cell while applying a programming signal to the memory cell, the current limit is based on the information indicative of resistance; and limiting the current available to the memory cell to the current limit while applying the programming signal.

11. The method of claim 1, wherein the pre-determined algorithm is based on a current-voltage relationship during the programming operation.

12. A method of operating non-volatile storage, the method comprising:

determining information indicative of resistance of a memory cell having a reversible resistivity-switching memory element;

determining whether a programming operation is complete based on the information;

determining one or more programming conditions to apply to the memory cell based on the information and a pre-determined algorithm that is based on properties of the memory cell having the reversible resistivity-switching memory element, the determining one or more programming conditions is performed if the programming operation is not yet complete;

applying the one or more programming conditions to the memory cell if the programming operation is not yet complete;

repeating the determining the information indicative of resistance, the determining whether the operation is complete, the determining one or more programming conditions, and the apply the one ore more programming conditions until it is determined that the programming operation is complete;

determining that a retry limit of a number of times for attempting the programming operation has been reached, the programming operation includes applying a signal having a first polarity to the memory cell; and applying one or more programming voltages having a second polarity that is opposite the first polarity to the memory cell.

13. A storage system, comprising:

a plurality of non-volatile memory cells, individual memory cells including a reversible resistivity-switching memory element; and one or more management circuits in communication with the plurality of non-volatile memory cells, the one or more management circuits determine information indicative of resistance of a first of the memory cells as a part of a programming operation, the one or more management circuits determine whether the programming operation is complete for the memory cell based on the information, the one or more management circuits determine a programming signal to apply to the memory cell based on the information indicative of resistance and a pre-determined algorithm that is based on properties of the memory cell having the reversible resistivity-switching memory element, the one or more management circuits determine a first programming signal when the information indicative of resistance is between a first value and a second value and determine a second programming signal when the information indicative of resistance is between the second value and a third value, the determining a programming signal is performed if the programming operation is not yet complete, the one or more management circuits apply the programming signal to the memory cell if the programming operation is not yet complete, the one or more management circuits continue to determine the information indicative of resistance, determine whether the programming operation is complete, determine a programming signal, and apply the programming signal until it is determined that the programming operation is complete for the memory cell.

14. The storage system of claim 13, wherein as a part of determining a programming signal the one or more management circuits determine one or more characteristics of a voltage pulse based on the information indicative of resistance.

15. The storage system of claim 14, wherein the one or more characteristics includes a voltage magnitude for the pulse.

16. The storage system of claim 14, wherein the one or more characteristics includes a pulse width.

17. The storage system of claim 13, wherein the programming operation includes SET, RESET, and forming.

18. The storage system of claim 13, wherein the reversible resistivity-switching memory element includes a metal oxide.

19. The storage system of claim 13, wherein the reversible resistivity-switching memory element includes carbon.

20. The storage system of claim 13, wherein the one or more management circuits determine a current limit for the memory cell to be used while applying a programming signal to the memory cell, the current limit is based on the information indicative of resistance.

21. The storage system of claim 13, wherein the pre-determined algorithm is based on a current-voltage relationship during the programming operation.

22. A storage system, comprising:
a plurality of non-volatile memory cells, individual memory cells including a reversible resistivity-switching memory element; and
one or more management circuits in communication with the plurality of non-volatile memory cells, the one ore more management circuits determine information indicative of resistance of a first of the memory cells as a part of a programming operation, the one or more management circuits determine whether the programming operation is complete for the memory cell based on the information, the one ore more management circuits determine a programming signal to apply to the memory cell based on the information indicative of resistance and a pre-determined algorithm that is based on properties of the memory cell having the reversible resistivity-switching memory element, the determining a programming signal is performed if the programming operation is not yet complete, the one or more management circuits apply the programming signal to the memory cell if the programming operation is not yet complete, the one or more management circuits continue to determine the information indicative of resistance, determine whether the programming operation is complete, determine a programming signal, and apply the programming signal until it is determined that the programming operation is complete for the memory cell, wherein the one ore more management circuits determine that a retry limit of a number of times for attempting the programming operation has been reached, the programming operation includes applying a signal having a first polarity to the memory cell, the one or more managing circuits apply one or more programming voltages having a second polarity that is opposite the first polarity to the memory cell in response to determining that the retry limit has been reached.

23. A method of operating non-volatile storage, the method comprising:
applying one or more programming signals to a memory cell having a reversible-resistivity switching material, the one or more programming signals having a first polarity;
determining whether a programming operation is complete in response to applying the one or more programming signals;
applying one or more additional programming signals having the first polarity to the memory cell if the programming operation is not complete and if a retry limit has not been reached;
applying one or more signals having a second polarity that is opposite the first polarity to the memory cell if the retry limit has been reached; and
retrying the programming operation by applying one or more additional programming signals having the first polarity to the memory cell after applying the one or more signals having the second polarity.

24. A storage system, comprising:
a plurality of non-volatile memory cells, individual memory cells including a reversible resistivity-switching memory element; and
one or more management circuits in communication with the plurality of non-volatile memory cells, the one or more management circuits apply one or more programming signals having a first polarity to a first of the memory cells, the one or more management circuits determine whether a programming operation is complete in response to applying the one or more programming signals, the one or more management circuits apply one or more additional programming signals signal having the first polarity to the first memory cell if the programming operation is not complete and if a retry limit has not been reached, the one or more management circuits apply one or more signals having a second polarity that is opposite the first polarity to the first memory cell if the retry limit has been reached, the one or more management circuits retry the programming operation by applying one or more additional programming signals having the first polarity to the first memory cell after applying the one or more signals having the second polarity.

25. A method of operating non-volatile storage, the method comprising:
determining information indicative of resistance of a memory cell having a reversible resistivity-switching memory element;
determining whether a programming operation is complete based on the information;
determining a current limit for the memory cell based on the information indicative of resistance and a pre-determined algorithm that is based on properties of the memory cell having the reversible resistivity-switching memory element, the determining the current limit is performed if the programming operation is not yet complete;
limiting the current available to the memory cell to the current limit while applying a programming signal to the memory cell when the programming operation is not yet complete; and
repeating the determining the information indicative of resistance, the determining whether the operation is complete, the determining a current limit, and the limiting the current available to the memory cell to the current limit while applying a programming signal until it is determined that the programming operation is complete.

26. The method of claim 25, wherein the determining a current limit for the memory cell based on the information indicative of resistance and a pre-determined algorithm includes:
determining a first current limit if the information indicative of resistance is between a first value and a second value and determining a second current limit if the information indicative of resistance is between the second value and a third value.

27. The method of claim 25, wherein the pre-determined algorithm is based on the type of material used for the reversible resistivity-switching memory element, wherein a first pre-determined algorithm is used when the reversible resistivity-switching memory element comprises a metal oxide and a second pre-determined algorithm is used when the reversible resistivity-switching memory element comprises carbon.

28. A storage system, comprising:
a three dimensional memory array having a plurality of non-volatile memory cells, individual memory cells including a reversible resistivity-switching memory element; and
one or more management circuits in communication with the plurality of non-volatile memory cells, the one or more management circuits determine information indicative of resistance of a memory cell having a reversible resistivity-switching memory element, the one or more management circuits determine whether a programming operation is complete based on the information, the one or more management circuits determine a current limit for the memory cell based on the information indicative of resistance and a pre-determined algorithm that is based on properties of the memory cell having the reversible resistivity-switching memory element, the one or more management circuits determine the current limit if the programming operation is not yet complete, the one or more management circuits limit the current available to the memory cell to the current limit while applying a programming signal to the memory cell when the programming operation is not yet complete, the one or more management circuits repeat the determining the information indicative of resistance, the determining whether the operation is complete, the determining a current limit, and the limiting the current available to the memory cell to the current limit while applying a programming signal until the one or more management circuits determine that the programming operation is complete.

29. The storage system of claim 28, wherein the one or more management circuits determine a first current limit when the information indicative of resistance is between a first value and a second value and determine a second current limit when the information indicative of resistance is between the second value and a third value.

30. The storage system of claim 28, wherein the resistivity-switching memory element includes carbon.

31. The storage system of claim 28, wherein the three dimensional memory array is a monolithic three dimensional array that includes multiple memory levels formed above a substrate.

32. The storage system of claim 13, wherein the plurality of non-volatile memory cells are part of a monolithic three dimensional array.

33. The storage system of claim 32, wherein the monolithic three dimensional array includes multiple memory levels formed above a single substrate.

34. The storage system of claim 22, further comprising a monolithic three dimensional array, wherein the plurality of non-volatile memory cells are formed within the monolithic three dimensional array.

* * * * *

UNITED STATES PATENT AND TRADEMARK OFFICE
CERTIFICATE OF CORRECTION

PATENT NO.        : 8,848,430 B2                                              Page 1 of 1
APPLICATION NO.   : 12/949146
DATED             : September 30, 2014
INVENTOR(S)       : Costa et al.

It is certified that error appears in the above-identified patent and that said Letters Patent is hereby corrected as shown below:

In the Claims

At Col. 30, line 4, claim 12: Before "the" and after "the", delete "apply" and insert -- applying --.

Signed and Sealed this
Thirty-first Day of March, 2015

Michelle K. Lee
*Director of the United States Patent and Trademark Office*